(12) United States Patent
Baschnagel

(10) Patent No.: US 9,444,920 B2
(45) Date of Patent: Sep. 13, 2016

(54) FLEX AND STAY CELL PHONE/ELECTRONIC DEVICE CHARGING STAND

(71) Applicant: Robert Baschnagel, Garden City, NY (US)

(72) Inventor: Robert Baschnagel, Garden City, NY (US)

( * ) Notice: Subject to any disclaimer, the term of this patent is extended or adjusted under 35 U.S.C. 154(b) by 0 days.

(21) Appl. No.: 13/941,664

(22) Filed: Jul. 15, 2013

(65) Prior Publication Data

US 2015/0018049 A1  Jan. 15, 2015

(51) Int. Cl.
*H02J 7/00* (2006.01)
*H04M 1/04* (2006.01)
*H04B 1/3883* (2015.01)
*B60R 11/02* (2006.01)
*H05K 5/00* (2006.01)
*H05K 5/02* (2006.01)
*H04M 1/02* (2006.01)
*B60R 11/00* (2006.01)

(52) U.S. Cl.
CPC ............... *H04M 1/04* (2013.01); *B60R 11/02* (2013.01); *H04B 1/3883* (2013.01); *H04M 1/0274* (2013.01); *H05K 5/0086* (2013.01); *H05K 5/0204* (2013.01); *H05K 5/0221* (2013.01); *H05K 5/0247* (2013.01); *B60R 2011/0059* (2013.01); *B60R 2011/0071* (2013.01); *H04M 1/0283* (2013.01); *H04M 2001/0204* (2013.01)

(58) Field of Classification Search
CPC .... H02J 7/0044; H02J 7/0027; H02J 7/0054; H02J 2007/0062
USPC .................................................. 320/114–115
See application file for complete search history.

(56) References Cited

U.S. PATENT DOCUMENTS

| | | | |
|---|---|---|---|
| 2013/0270002 A1* | 10/2013 | Fawcett | 174/84 S |
| 2014/0057487 A1* | 2/2014 | May | H01R 13/60 439/530 |
| 2014/0139183 A1* | 5/2014 | Baschnagel, III | 320/115 |

* cited by examiner

*Primary Examiner* — Nghia Doan

(57) ABSTRACT

The flex and stay cell phone/electronic device charging stand of the present invention is a USB cable used to hold a cell phone/electronic device in a standing position while it is used to synchronize and charge said cell phone/electronic device. It has two unique features. On the front end there is a removably attachable sleeve that allows for the USB cord to flex and stay in a bent position. This allows the user of the cord to create a stand for his or her electronic device for ease of use on a table or flat surface. On the back end of the cord is a removably attachable docking station for a cell phone or electronic device so when the device is being charged it can sit next to the wall outlet with an easy way to access said device.

10 Claims, 27 Drawing Sheets

FLEX AND STAY CELL PHONE/ELECTRONIC DEVICE CHARGING STAND

CROSS-REFERENCE

This is a continuation-in-part application to the U.S. application Ser. No. 13/766,387, filed on Feb. 13, 2013, from which priority is claimed, and entirety of which is hereby incorporated by reference.

BACKGROUND OF THE INVENTION

1. Field of the Invention

This invention relates generally to a unique USB cable that has unique features associated with said cable at both distal ends of the wire to offer a unique combination of functionality to a user of said device. As such this product serves as a cell phone/electronic device charging stand as well as providing what is referred to herein as "flex and stay" properties to one or both ends of the USB cable by having a removable attached sleeve that is used to bend and shape the USB cable into shapes that can be used to hold a cell phone/electronic device in a standing position on a table or flat surface.

2. Description of Related Art

A Universal Serial Bus ("USB" hereinafter) cable for charging and synchronizing a cell phone or electronic device is known in the prior art. Nevertheless, a typical USB cable cannot hold a cell phone or electronic device in a standing position while it is being charged or synchronized.

Electronic devices are defined herein as including but are not limited to mobile phones, smart phones, and multimedia players.

In differing from prior art, this invention serves to modify a traditional USB cable which has a primary use of charging a cell phone so that it can be used to support a cell phone or electronic device in a standing position for easy access while said cell phone or electronic device is being charged or synchronized. Such device can further be coupled with various additional features that enhance the desire to use such a device.

For example a stylus cap can be added to the tip of this device to serve a duel role of protecting one end of the USB cable and at the same time allowing a user to have a handy stylus at hand for use with their electronic device.

Further, two of the removably attached wire flex and stay devices can be attached to other wires which do more than just charge cell phones such as a cell phone ear piece wire. By doing this one end of the earpiece wire can serve to support the cell phone on a table and the other end could help the user wrap the earpiece wire around the user's ear to help support the earpiece.

It is important to note that any wire that plugs into an electronic device such as a stereo system where there are wires coming out of the back of the device could incorporate such a system as the one described herein.

This could be applied as a way to bend the wires for a neat and uniform appearance. While the wire used herein has a USB cable fitting at the one end it should be understood that any such wire fitting with either as USB plug or any other electronic related plug will work with said invention.

Evenso, this being said, the basic functioning of this device is to offer firm structural support to a wire and yet have easy bendable properties so as to be able to serve as a table supporting structure for an attached electronic device while said device is plugged into a charging outlet. Thereafter, when said device is still in need of a charge but no longer needed to remain on a table, this invention allows for the USB wire to be wrapped around itself and the phone to be stored up against a wall electrical outlet.

SUMMARY OF THE INVENTION

The flex and stay cell phone/electronic device charging stand of the present invention is a traditional USB cable used to hold a cell phone/electronic device with a removably attached flexable device that allows for rigidity in the USB cable and thereby creates a support leg for the electronic device when said device is positioned in a standing position while it is used to synchronize and charge said cell phone/electronic device.

The structure of the flex and stay device described herein is such that it allows for a charging cord to have features located at either end of the cord itself that provide rigidity to the cord for about 4 to 6 inches at the end of both sides of the cord. This addresses common issues with the end that plugs into the electronic device itself and common issues that arise with the opposite end that plugs into a common electrical wall outlet.

The flex and stay charging stand of the present invention consists of the following:
1. a USB wire
2. two USB connections at either end
3. a removably attached flex and stay wire support system that can be place at one or both ends of the USB wire.
4. A unique docking station that is connected to one end of the USB wire.

This invention allows for one end of the charging wire that plugs into an electrical outlet to have a supporting stand for a cell phone or electronic device so it can sit next to the wall outlet with an easy access propping platform. This is such that said cell phone/electronic device is allowed to stand on a flat surface flush against the electrical outlet wall while the cell phone/electronic device is synchronized and charging through the USB port connected.

Additionally, the opposite side of the USB wire that is used to plug into the cell phone has a removably attached sleeve that has the unique ability to bend easily yet keep the USB wire firm enough to help support a cell phone in an upright position. As such, when the phone is in use but still being connected to a wall charging outlet, this end of the invention allows for the phone to remain in a standing position.

Many times when a cell phone is used for a long period of time the user prefers to keep the phone connected to a wall outlet to preserve the battery life of said device. Yet, at the same time there is a need to support the cell phone in an upright position on a table for ease of viewing. This device provides an easy solution.

The technology for manufacturing a USB charging and synchronizing cable is known in the field and, thus it is not discussed in this application.

The flex and stay charging stand according to the present invention has unique features at either end or in other words—at both ends of the cable. This addresses two issues of the need for support for the electronic device both on a table when in use by an end user as well as issues of access and support of the device when it is being charged from an electrical wall outlet.

According to one embodiment of the present invention, the flex and stay charging stand has a removably attachable sleeve at the front of the cable that allows for the USB cord to flex and stay in a bent position. This allows the user of the flex and stay charging stand of the present invention to create a stand for his or her electronic device for ease of use on a table or flat surface. Such permanent or removably attachable sleeve can also have a covering element to protect the tip of the USB cord when the cord is not plugged into a device and exposed to the environment. Thereon said cover can also have a stylus tip that can be used as a stylus in conjunction with the USB cord itself.

In order to support the electronic device on a table with just a wire that is extending out of the USB port—two issues need to be addressed.

1. The first is the strength of the flexible wire to support the device and
2. the second issue is to have a clamping feature around the USB plug so that pressure on the phone is distributed away from the plug where possible damage with too much pressure could result.

Therefore, various embodiments have been developed wherein either a slid forward and support tip like structure can serve as support at the tip of this invention to extend forward from the wire and over the electronic device. Or in another embodiment, a clamping feature has been used to clamp onto the electronic device around the frame of said device where the USB port is located. Each of these variations serve to add support to the flexible wire as well as to distribute pressure away from the plug outlet on said electronic device as the wire is used as a standing leg for the electronic device itself.

The wire encasing structure of said invention which is at the core of this flex and stay device is such that it is easy to bend using two hands or by pushing said encasing between the thumb and first two fingers of one hand to achieve an "L" like shape or "J" like shape. This shaping of the USB wire can then serve as a back supporting extension leg for an electronic device that is angled at about 25 degrees backward on a table.

With the device tilting backward by 25 degrees and the flexible wire tilting down and back to a similar opposite angle—in combination with the device—both device and supporting wire extending from device create an upside down "V" like structure which inherently can serve to allow for the electronic device to "stand" on a table top. This combination effectively creates a support system for said device on a table.

In regard to the back end or opposite end of the charging cable where the flex and stay support system is not located, according to another embodiment of the present invention, the flex and stay charging stand has a docking station at the back end of the cable for holding a cell phone or electronic device in a stand position so when the cell phone/electronic device is being charged or synchronized it can sit next to the wall outlet with an easy way to access said cell phone. This will prevent the device from being set on the floor to charge or having a long wire run from an electric outlet in the wall to a table which a person can trip over and knock the electronic device off of the table and possibly break said device.

According to another embodiment of the present invention, the flex and stay charging stand has both a removably attachable sleeve at the front end to enable the cell phone or electronic device to stand on a flat surface and a docking station at the back end of the cable to enable the cell phone or electronic device to sit next to the wall outlet while the cell phone/electronic device is charged or synchronized.

The flex and stay charging stand is compatible with any universal battery charger with USB port or any computer with USB port.

The flex and stay charging stand further comprises a universal battery charger with USB port. This universal battery charger with USB port has charging prongs which may be adjustable.

The more important features of the invention have thus been outlined in order that the more detailed description that follows may be better understood and in order that the present contribution to the art may better be appreciated. Additional features of the invention will be described hereinafter and will form the subject matter of the claims that follow.

Before explaining at least one embodiment of the invention in detail, it is to be understood that the invention is not limited in its application to the details of construction and the arrangements of the components set forth in the following description or illustrated in the drawings. The invention is capable of other embodiments and of being practiced and carried out in various ways. Also it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

The foregoing has outlined, rather broadly, the preferred feature of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention and that such other structures do not depart from the spirit and scope of the invention in its broadest form.

BRIEF DESCRIPTION OF THE DRAWINGS

Other aspects, features, and advantages of the present invention will become more fully apparent from the following detailed description, the appended claim, and the accompanying drawings in which similar elements are given similar reference numerals.

DESCRIPTION OF THE PREFERRED EMBODIMENT

Figure 1:
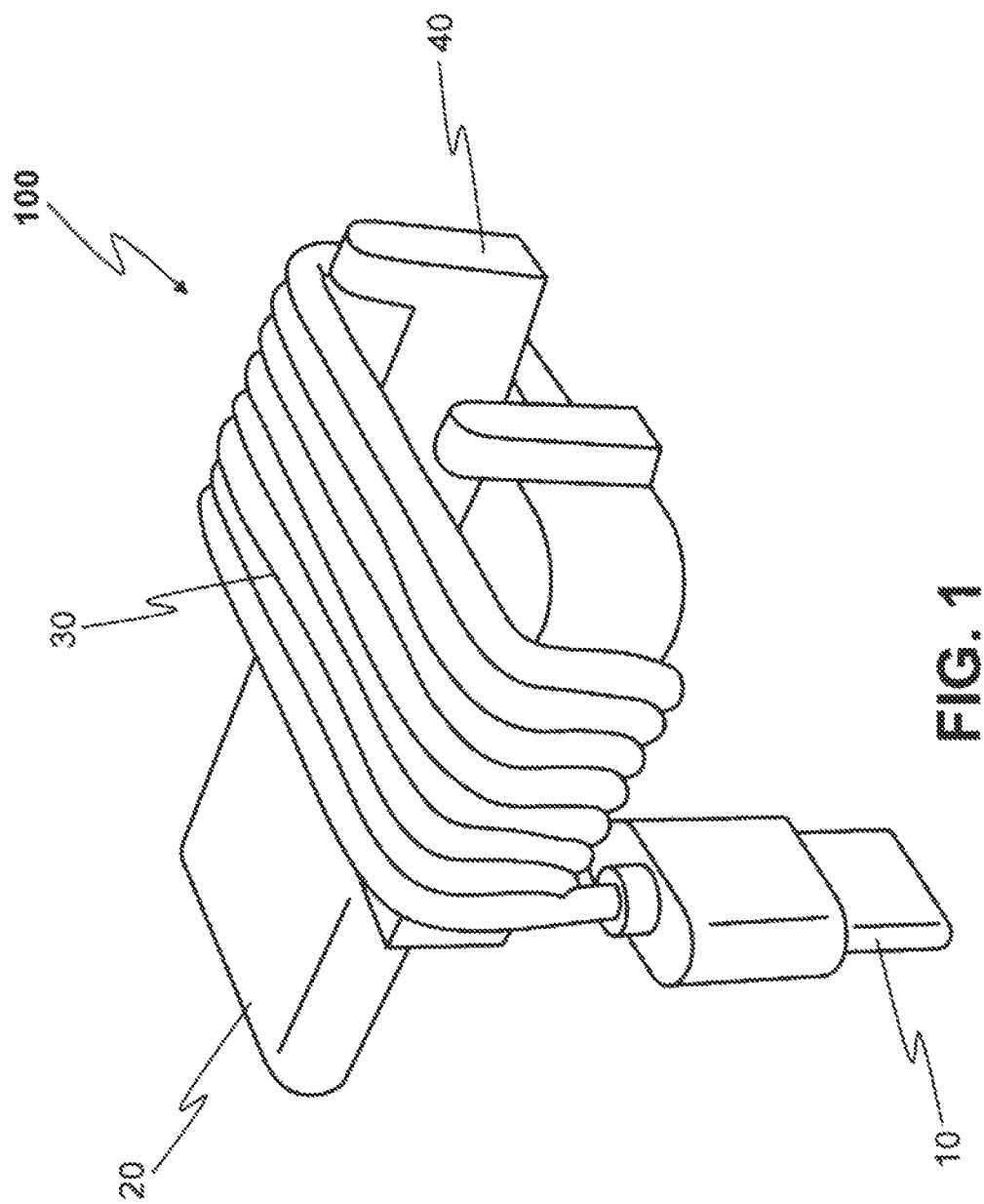
FIG. 1 is a perspective view of a flex and stay charging stand in a stowed position according to one embodiment of the present invention.
Figure 2:
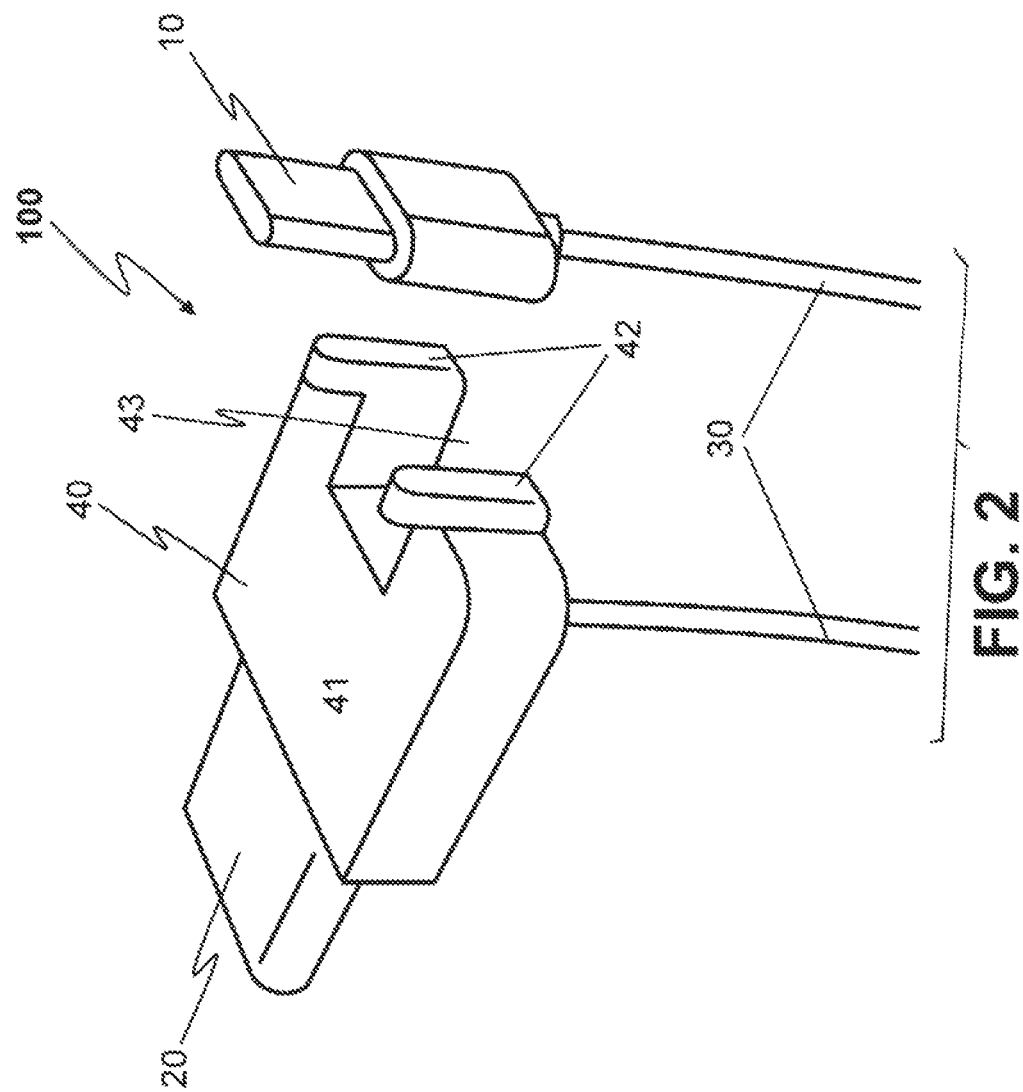
FIG. 2 is a perspective view of the embodiment of the flex and stay charging stand of FIG. 1 in a ready to use position.

Referring to FIG. 1, there is disclosed a flex and stay cell phone/electronic device charging stand 100 according to one embodiment of the present invention in a stowed position. Similar to a typical USB cable for charging a cell phone/electronic device, the flex and stay charging stand 100 of the present invention in this embodiment has a USB plug 10 at its front end for connecting to a USB port on a cell phone, another USB plug 20 at its back end for connecting to a USB port on a charger or a computer, and cord 30. In addition, the embodiment 100 has a docking station 40 for receiving a cell phone/electronic device so when the cell phone/electronic device is being charged it can sit next to the wall outlet with an easy way to access said cell phone/electronic device. FIG. 2 is a perspective view of the embodiment of the flex and stay charging stand of FIG. 1 in a ready to use position. The docking station 40 in this embodiment comprises a substantially U-shaped base 41 and two vertical bars 42 which protrude upwards at the front of the base. The base 41 holds the bottom of the cell phone and the two vertical bars 42 hold the front of the cell phone. The substantially U-shaped slot 43 is defined at the front of the base 41 and is configured to match the front-end USB plug 10 so that when the front-end USB plug 10 is inserted into the USB port of the cell phone it can snugly fit in the U-shaped slot 43 while the cell phone is standing within the docking station 40. The shape of the base 41 or the front-end plug receiving slot 43 may vary in other embodiments.

Figure 3:
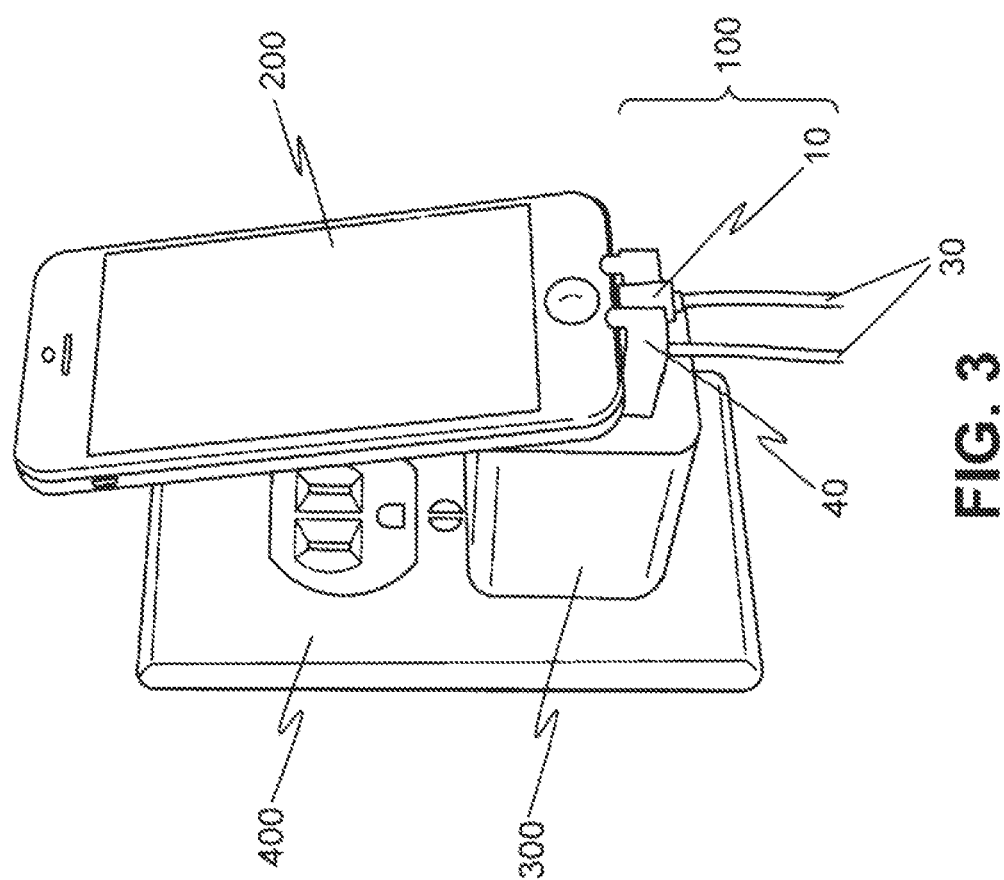
FIG. 3 is an isometric view of the embodiment of the flex and stay charging stand of FIGS. 1 and 2 in operation, mounted on a wall charger and accommodating a cell phone.
Figure 4:
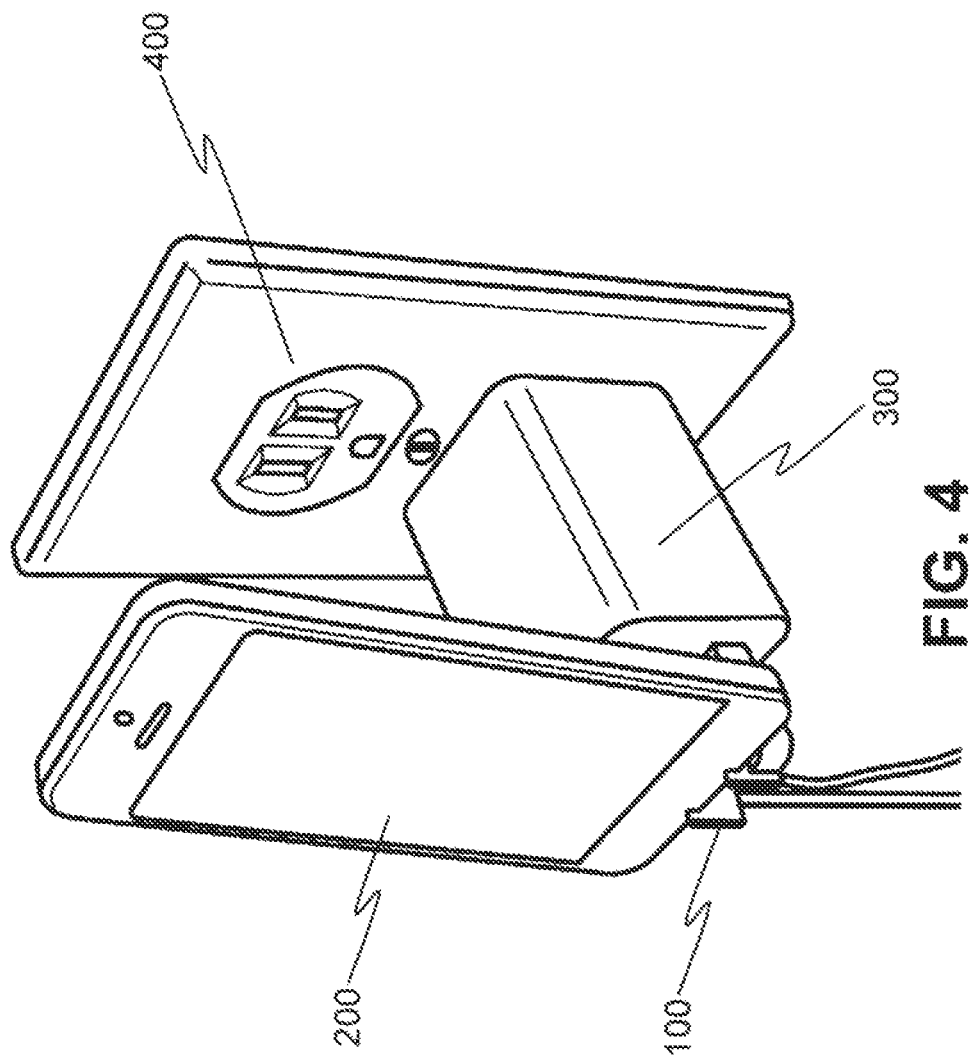
FIG. 4 is an isometric view of the embodiment of the flex and stay charging stand of FIGS. 1 and 2 in operation, mounted on a wall charger and accommodating a cell phone.
Figure 5:
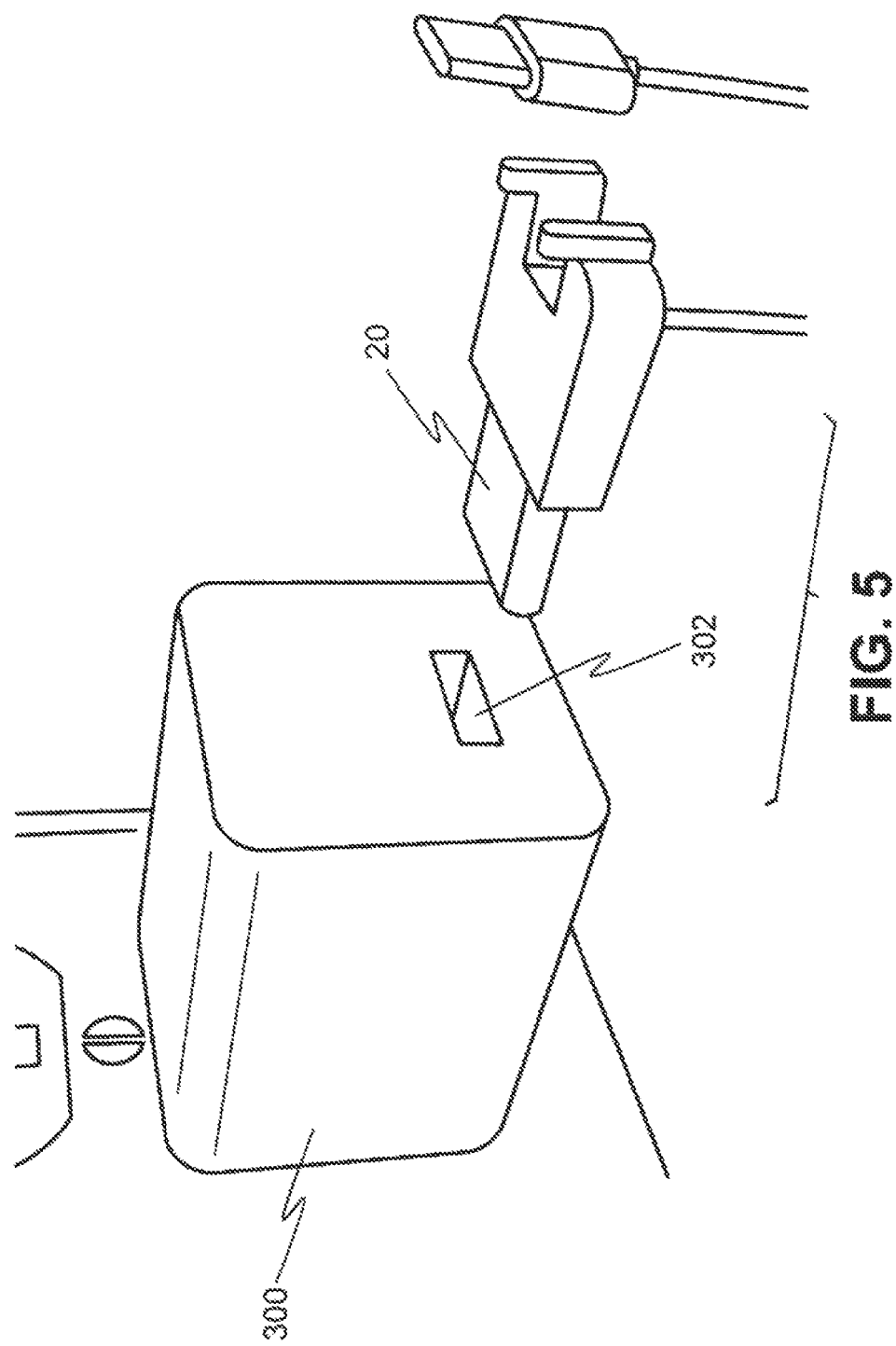
FIG. 5 is an isometric view of the embodiment of the flex and stay charging stand of FIGS. 1 and 2 ready to plug into the wall charger which is plugged into the wall outlet.
Figure 6:
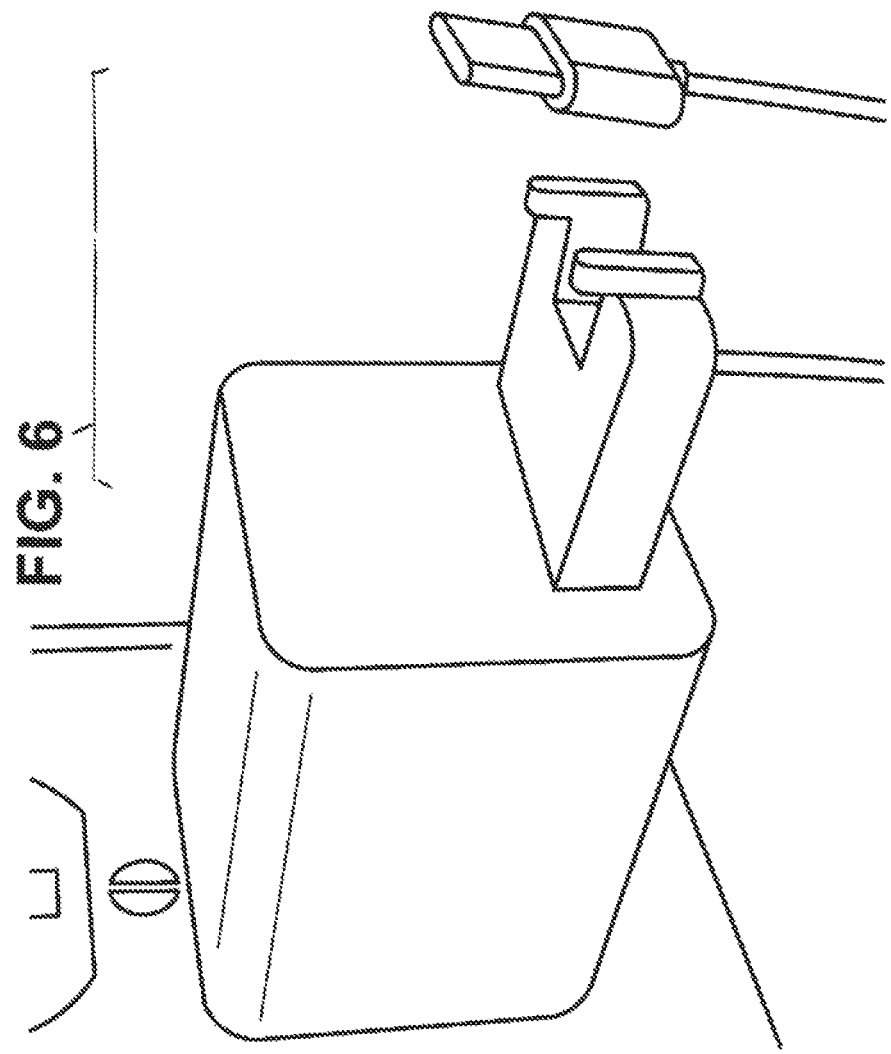
FIG. 6 is an isometric view of the embodiment of the flex and stay charging stand of FIGS. 1 and 2 which is mounted to the charger 300 via the USB plug at the back end.
Figure 7:
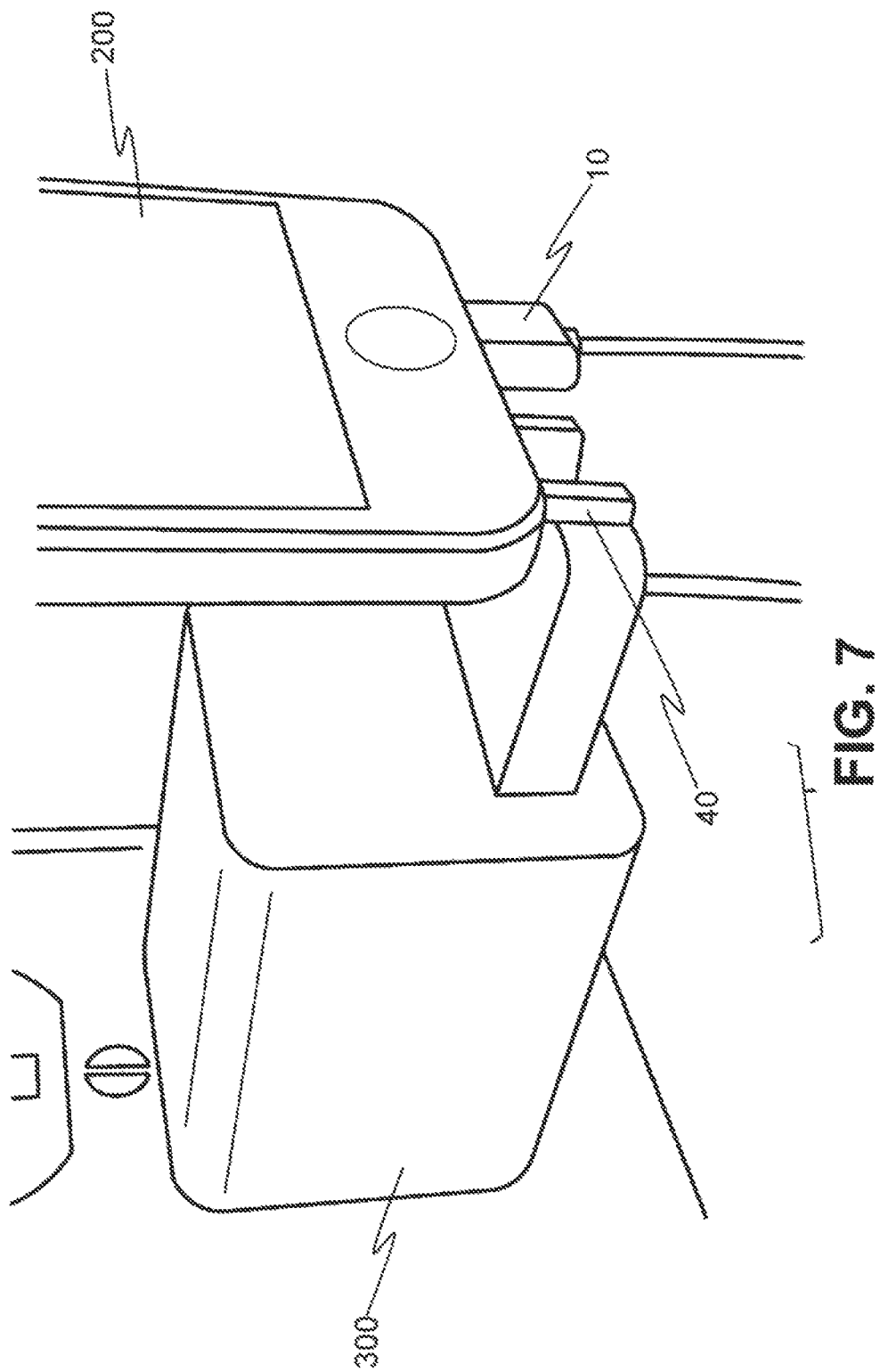
FIG. 7 illustrates an isometric view of the embodiment of the flex and stay charging stand of FIGS. 1 and 2 wherein the front-end USB plug of the device is connected to the cell phone before the cell phone is put on the docking station.
Figure 8:
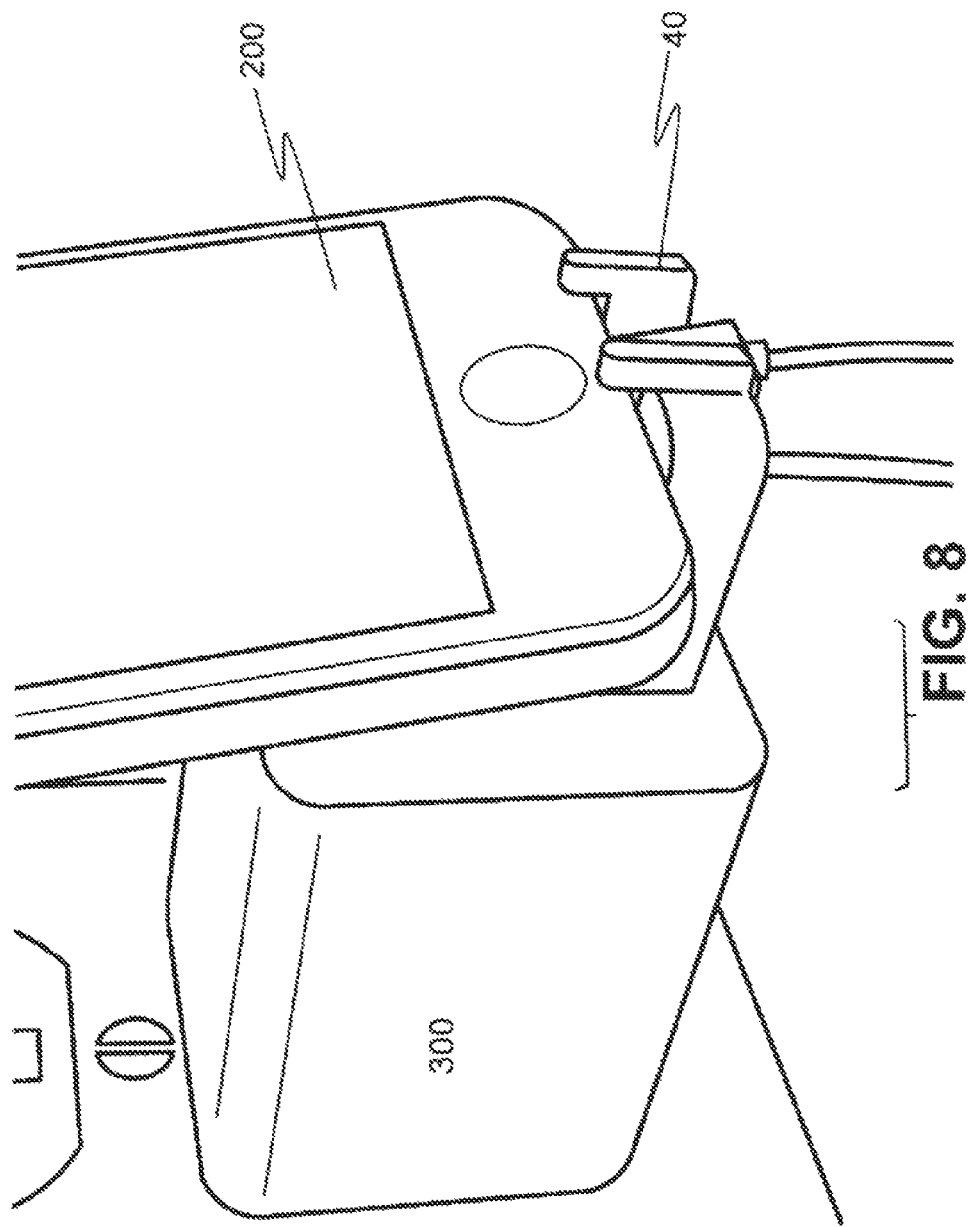
FIG. 8 is an isometric view of the embodiment of the flex and stay charging stand of FIGS. 1 and 2 which is connected to the cell phone and holds the cell phone on its docking station so the cell phone is next to the wall charger and easy to access for use.
Figure 9:
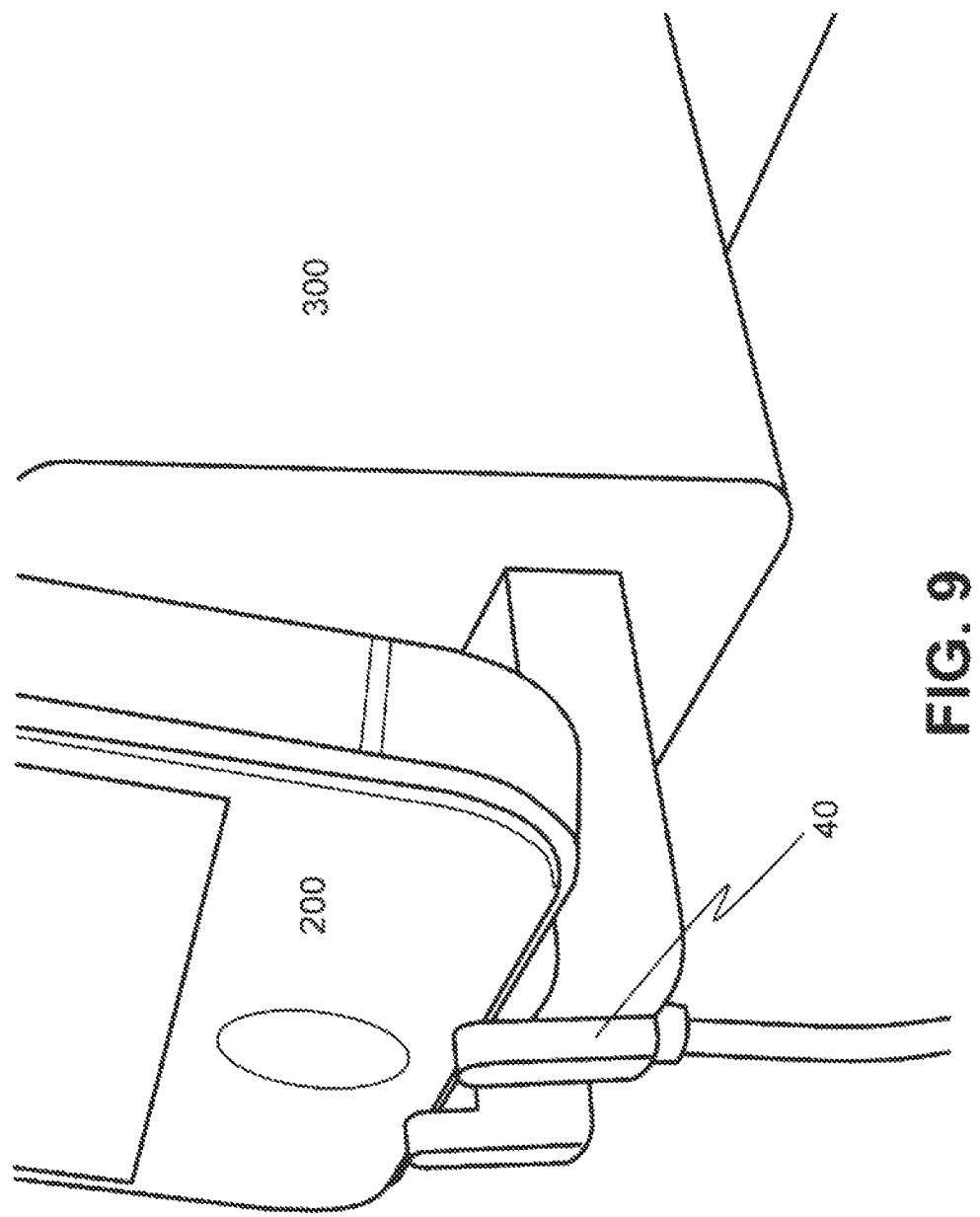
FIG. 9 is another isometric view of the embodiment of the flex and stay charging stand of FIGS. 1 and 2 which is connected to the cell phone and holds the cell phone on its docking station so the cell phone is next to the wall charger and easy to access for use.
Figure 10:
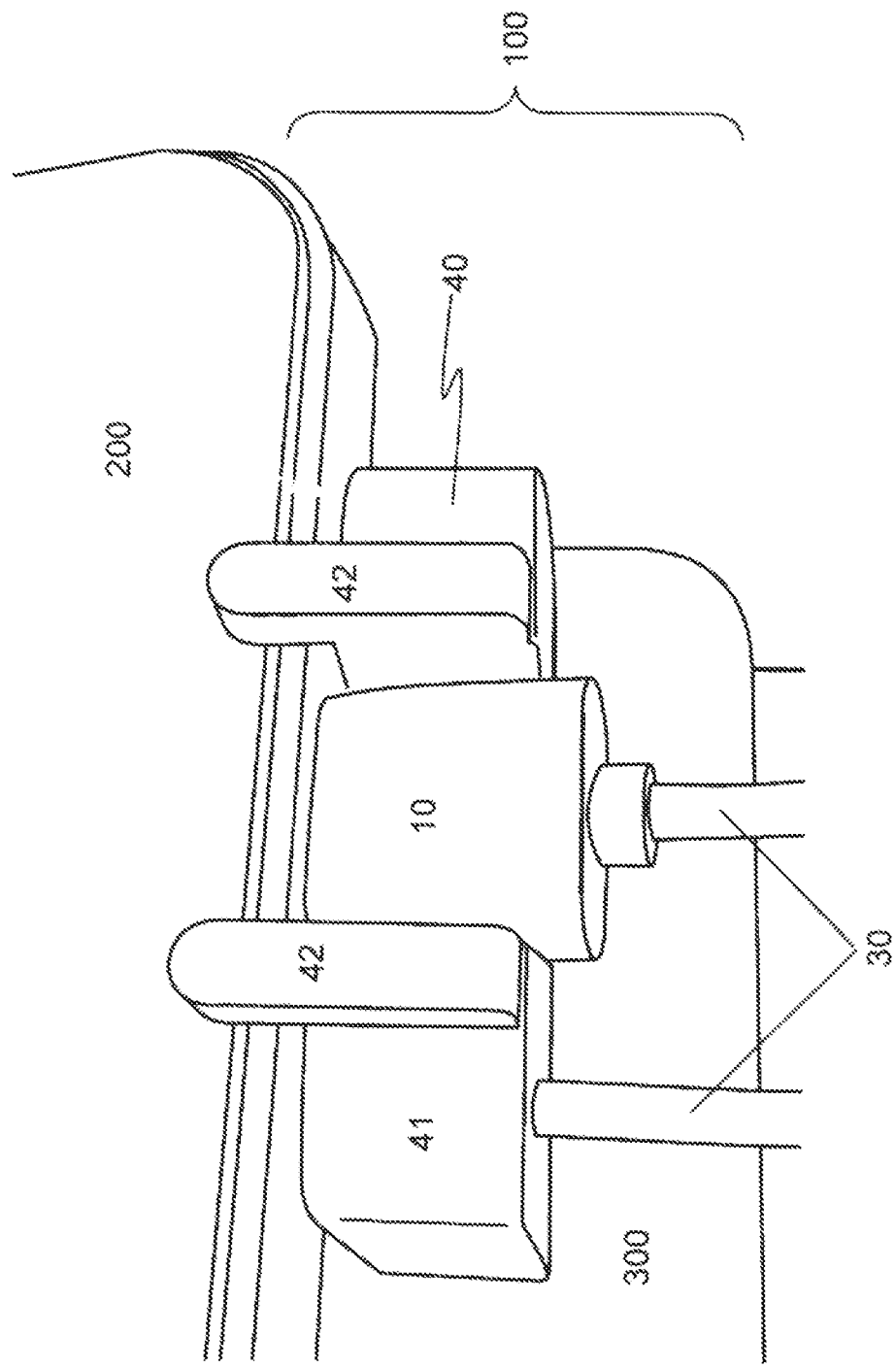
FIG. 10 is another isometric view of the embodiment of the flex and stay charging stand of FIGS. 1 and 2 which is connected to the cell phone and holds the cell phone on its docking station so the cell phone is next to the wall charger and easy to access for use.

FIGS. 3-4 illustrate the embodiment 100 in operation wherein the cell phone 200 sits on the docket station 40 of the device 100 while it is charged by the charger 300 which is plugged into the wall outlet 400. The USB plug at the front end 10 is connected to the cell phone 200 and the USB plug at the back end 20 (not observable in FIGS. 2-3) is connected to the charger 300 which is plugged into the wall outlet 400. FIG. 5 is an isometric view of the embodiment of the flex and stay charging stand of FIGS. 1 and 2 ready to plug into the wall charger which is plugged into the wall outlet. In this figure, the USB plug at the back end 20 of the flex and stay charging stand 100 is ready to insert into the USB port 302 of the charger 300. In FIG. 6, the flex and stay charging stand 100 is mounted to the charger 300 via the USB plug at the back end 20 (not observable in FIG. 6). FIG. 7 illustrates an isometric view of the flex and stay charging stand 100 having the front-end USB plug 10 connected to the cell phone 200 before the cell phone is put on the docking station 40. FIGS. 8-10 show the cell phone 200 sitting on the docking station 40 of the flex and stay charging stand and leaning against the charger 300. FIG. 10 clearly shows that the front-end USB 10 when plugged into the USB port on the cell phone 200, it snugly fits into the substantially U-shaped slot 43 of the docking station 40 and the cell phone 200 is securely held in place by the base 41 and two bars 42 of the docking station 40.

Figure 11:
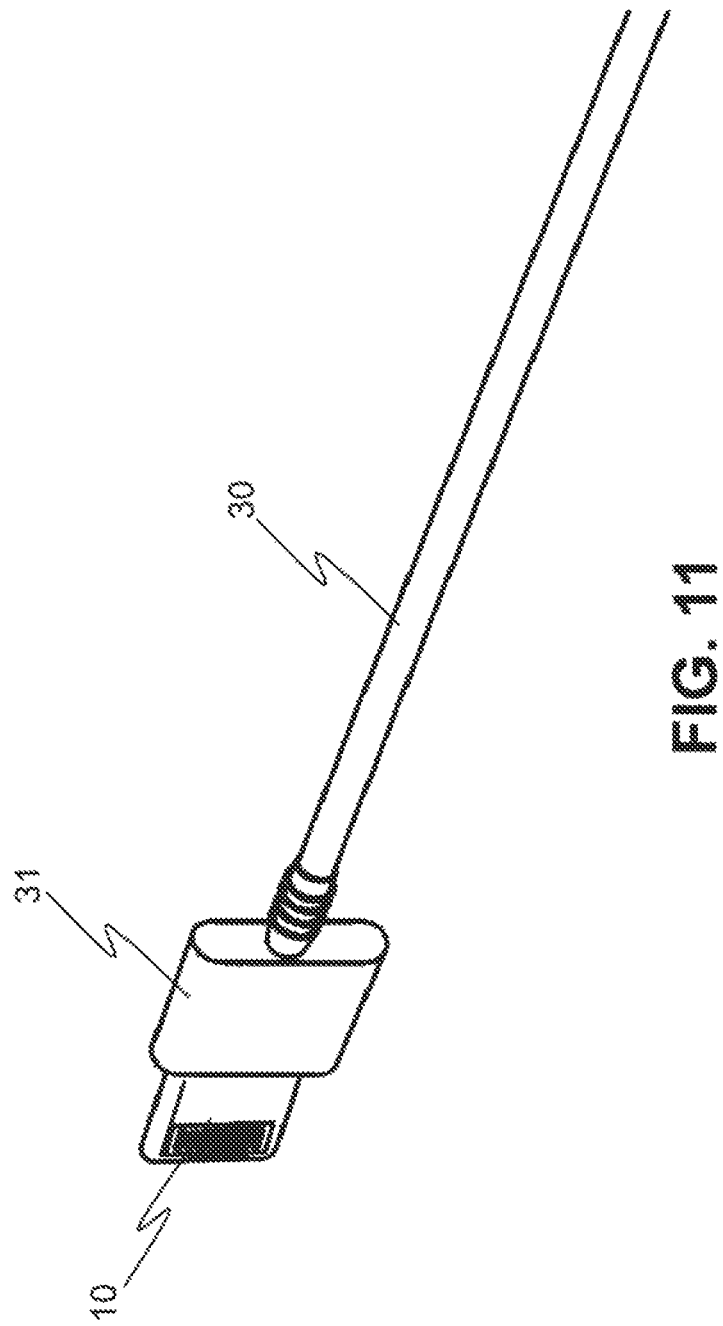
FIG. 11 shows the front end of the flex and stay cell phone/electronic device charging stand including the front-end USB plug 10 for connecting to the cell phone/electronic device and the front of the USB cord 20.
Figure 12:
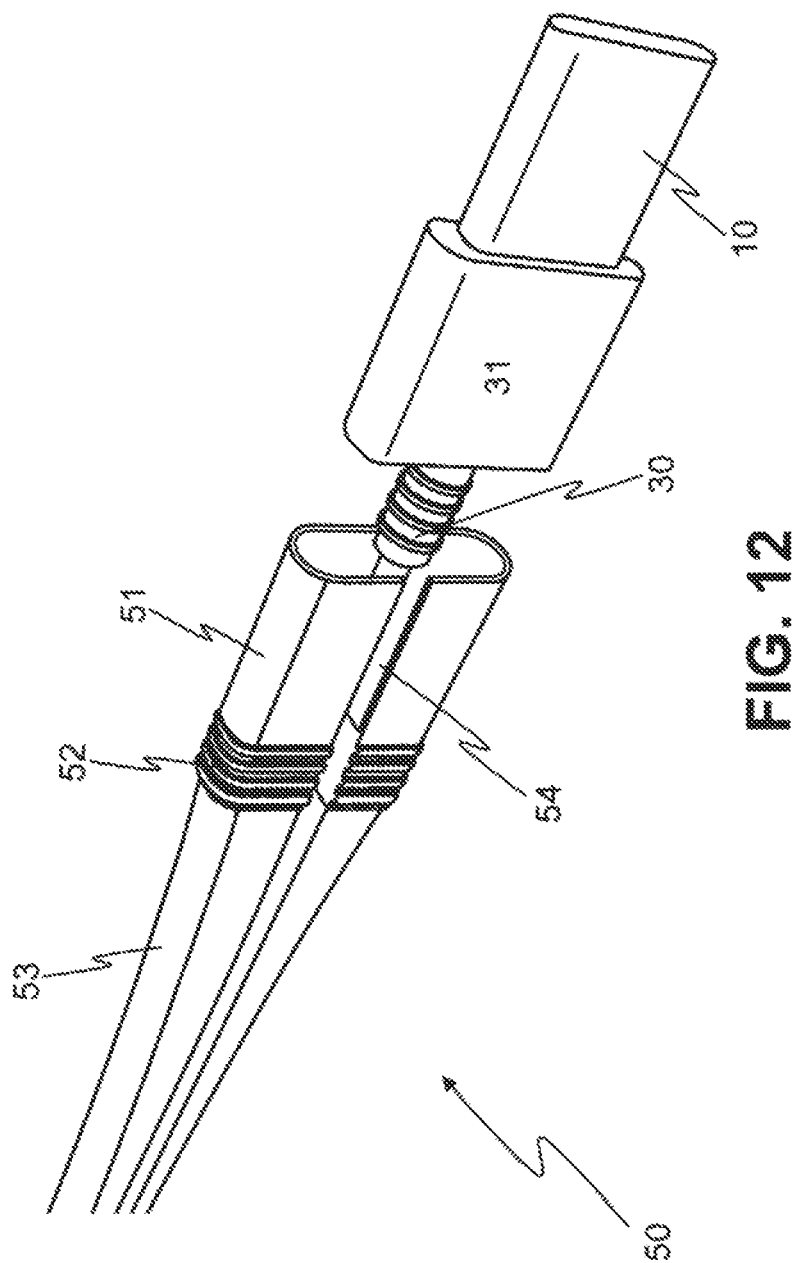
FIG. 12 is the rear view of the removably attachable sleeve which partially encircles the USB cord.
Figure 13:
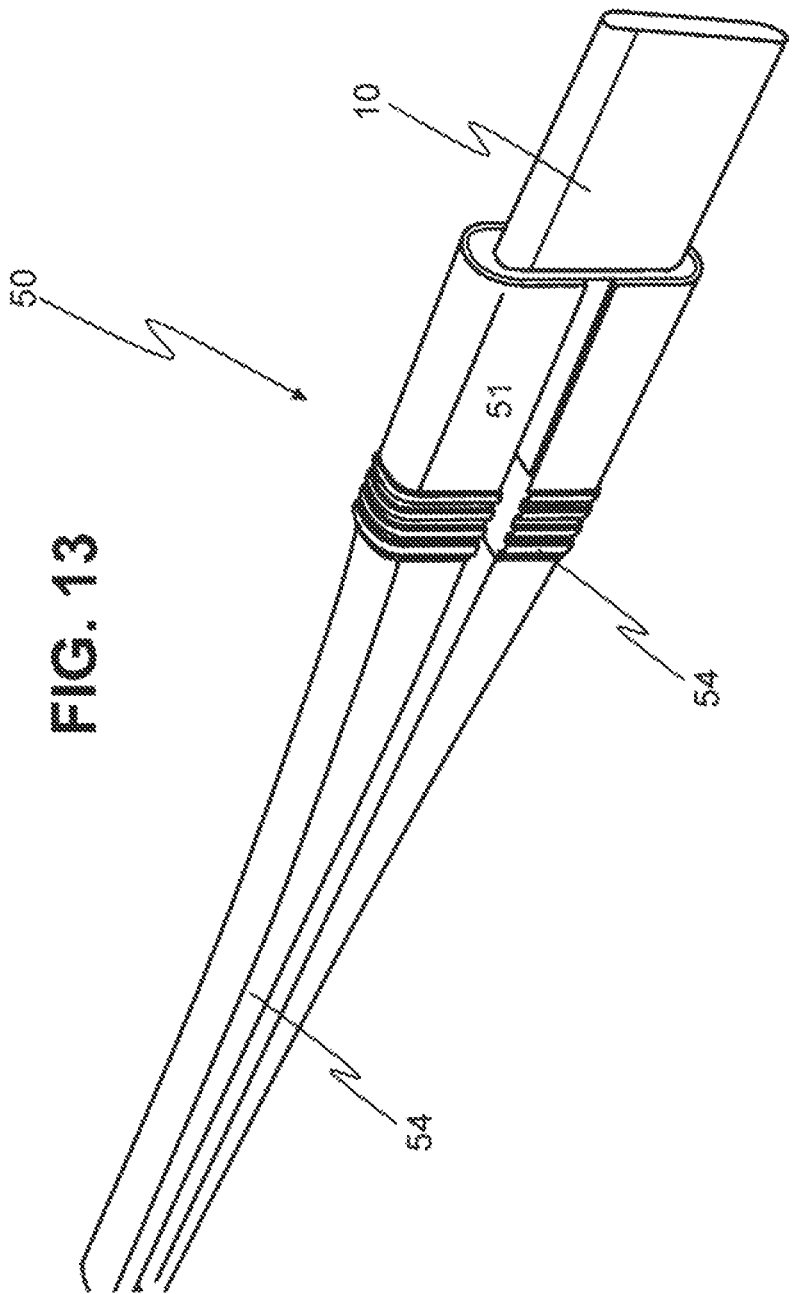
FIG. 13 is the rear view of the rear view of the removably attachable sleeve which completely encircles the front end of the USB cord.

The flex and stay cell phone/electronic device charging stand further comprises a removably attachable sleeve that is designed to encircle the front end of the USB cord thereby enables the USB cable to flex and stay in a bent position. This allows the user of the flex and stay charging stand of the present invention to create a stand for his or her cell phone/electronic device for ease of use on a table or on a flat surface. FIG. 11 shows the front end of the flex and stay cell phone/electronic device charging stand 100 including the front-end USB plug 10 for connecting to the cell phone/electronic device and the front of the USB cord 30 which includes the base of the front-end USB plug 31. FIG. 12 shows the rear view of the removably attachable sleeve 50 partially encircles the USB cord 30 and FIG. 13 shows the rear view of the removably attachable sleeve 50 completely encircles the front end of the USB cord 30 (not observable in FIG. 13). The removably attachable sleeve 50 has a rigid front region 51 for encircling the base of the front-end USB plug 31 and a flex region 52 for circling the front end of the cord 30, and a another rigid region 53 for encircling the middle part of the cord 30. The removably attachable sleeve 50 of the present invention can be bent at the flex region 52 to any desired angle by a user to create a stand to support the cell phone. The removably attachable sleeve 50 has a groove 54 on its rear side along the length to allow the USB cord 30 to insert thereinto.

Figure 14:
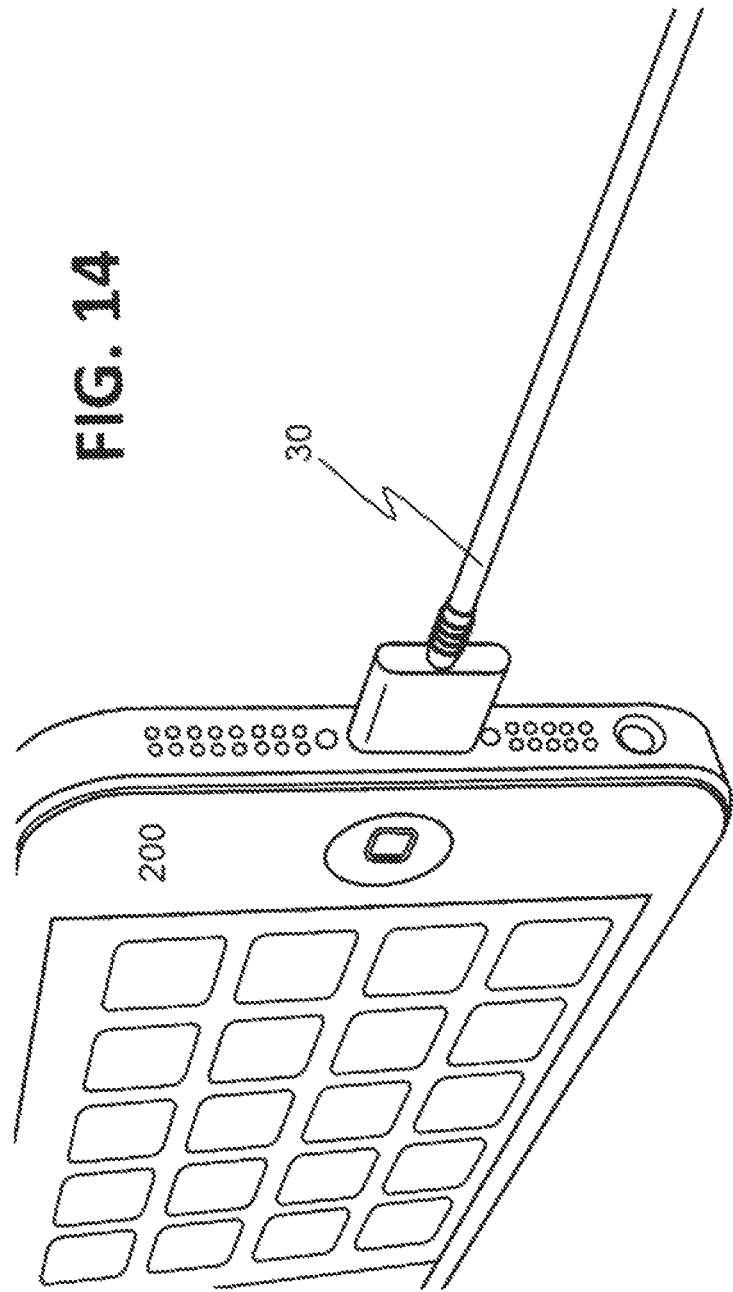
FIG. 14 is an isometric front view of a typical USB cable connected to a cell phone.
Figure 15:
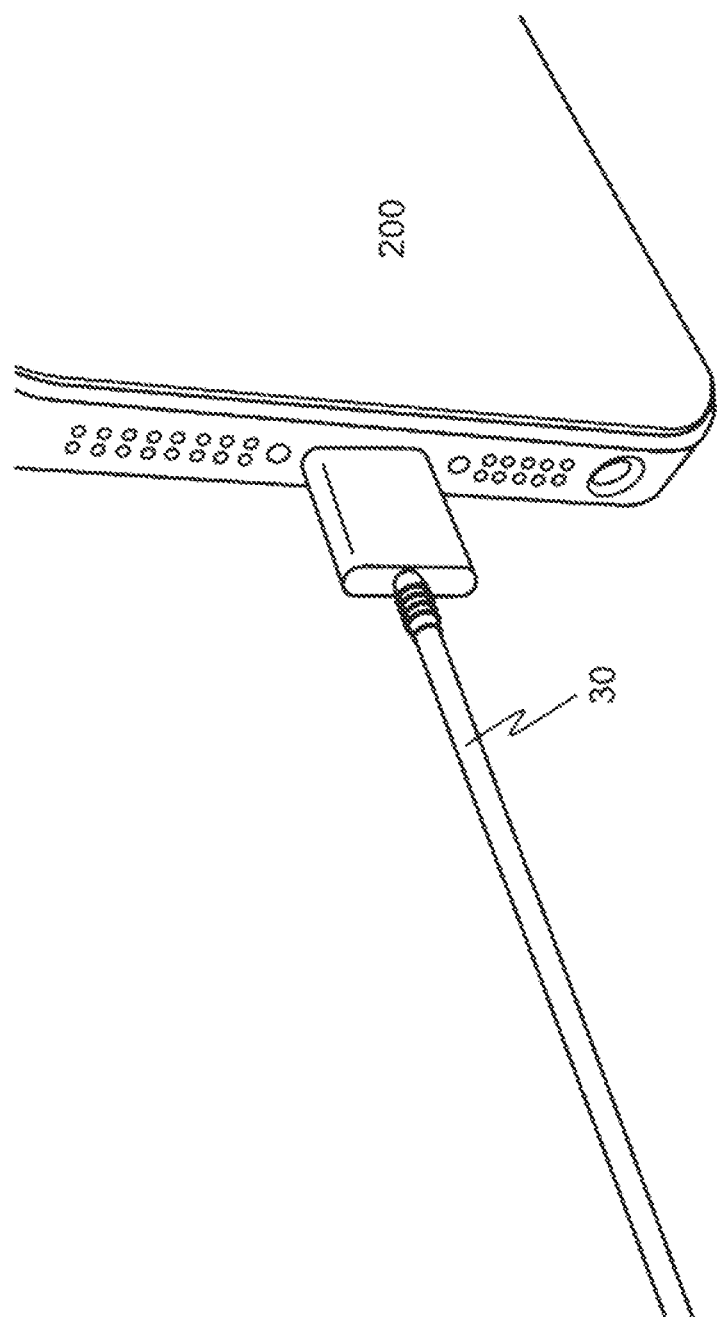
FIG. 15 is an isometric rear view of a typical USB cable connected to a cell phone.
Figure 16:
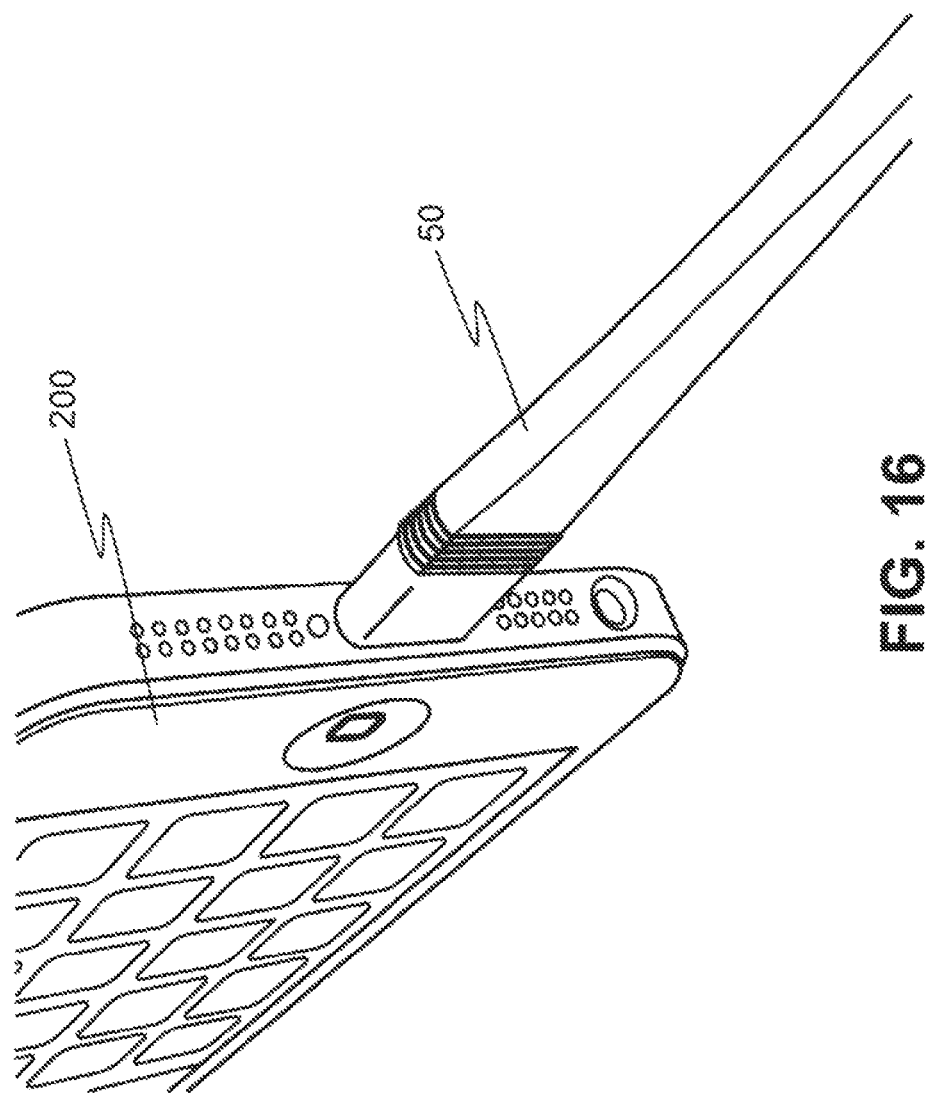
FIG. 16 is an isometric front view of a flex and stay cell phone/electronic device charging stand connected to a cell phone in a straight position.
Figure 17:
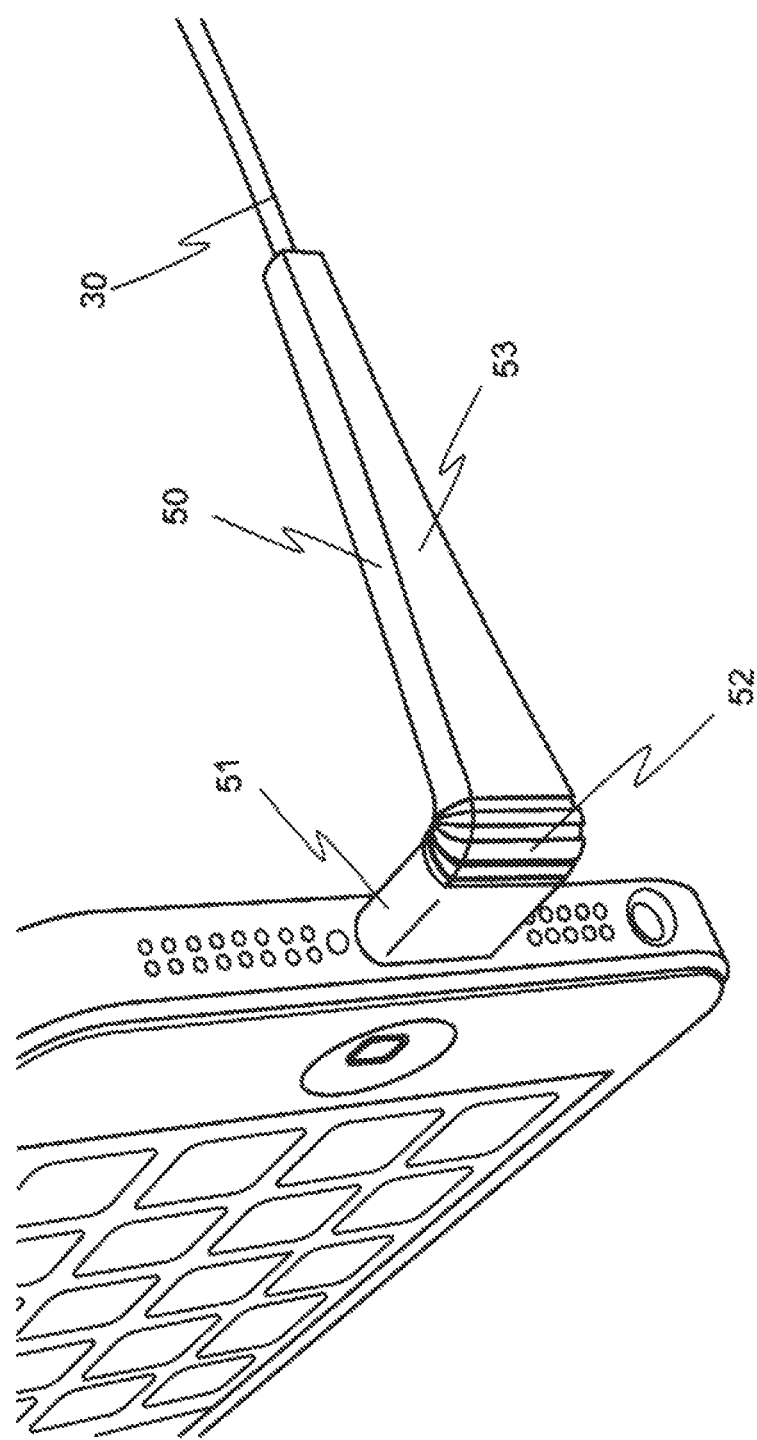
FIG. 17 is an isometric front view of a flex and stay cell phone/electronic device charging stand connected to a cell phone wherein the sleeve attached UBS cord is bent in about 90 degree angle.
Figure 18:
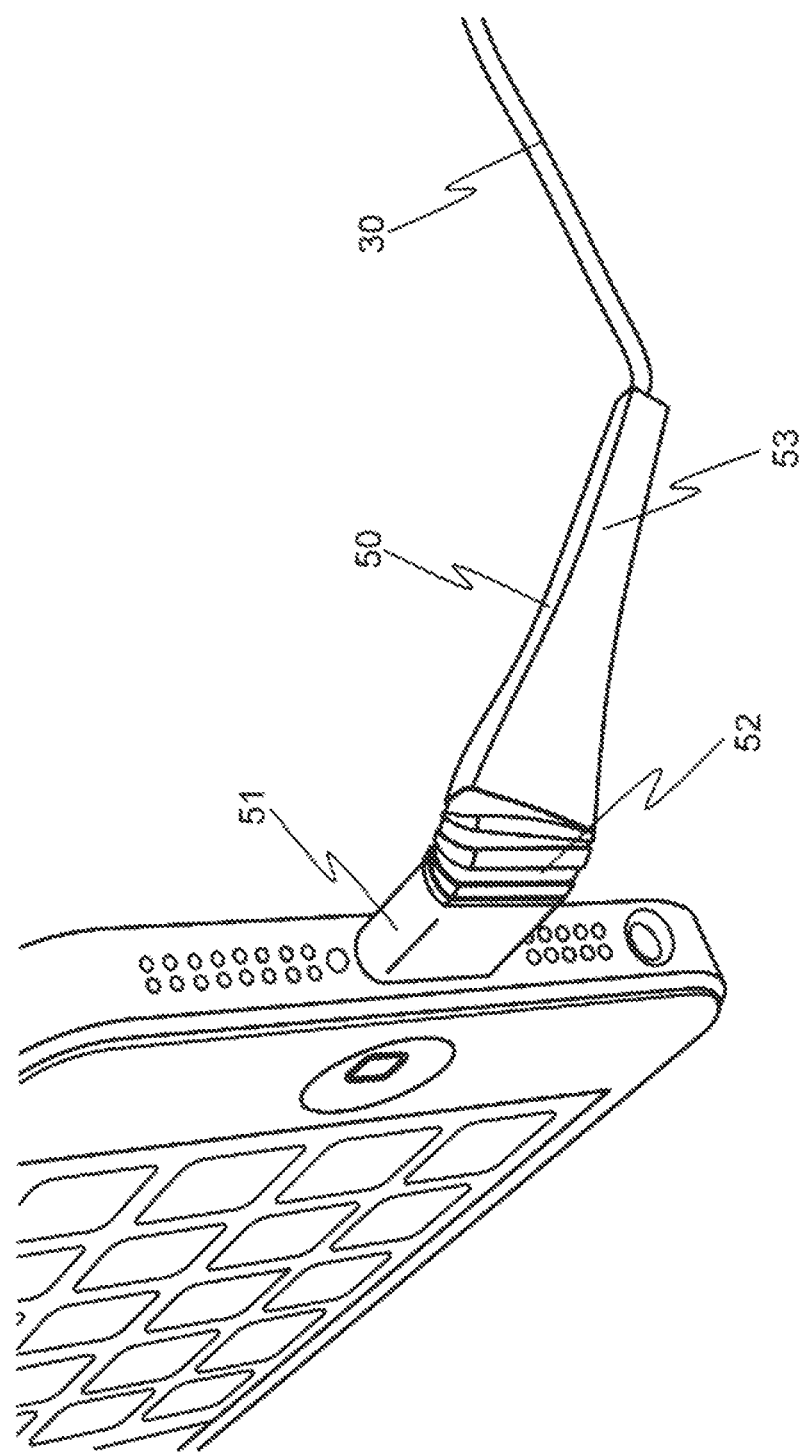
FIG. 18 is an isometric front view of a flex and stay cell phone/electronic device charging stand connected to a cell phone wherein the sleeve attached UBS cord is bent towards the flat surface.
Figure 19:
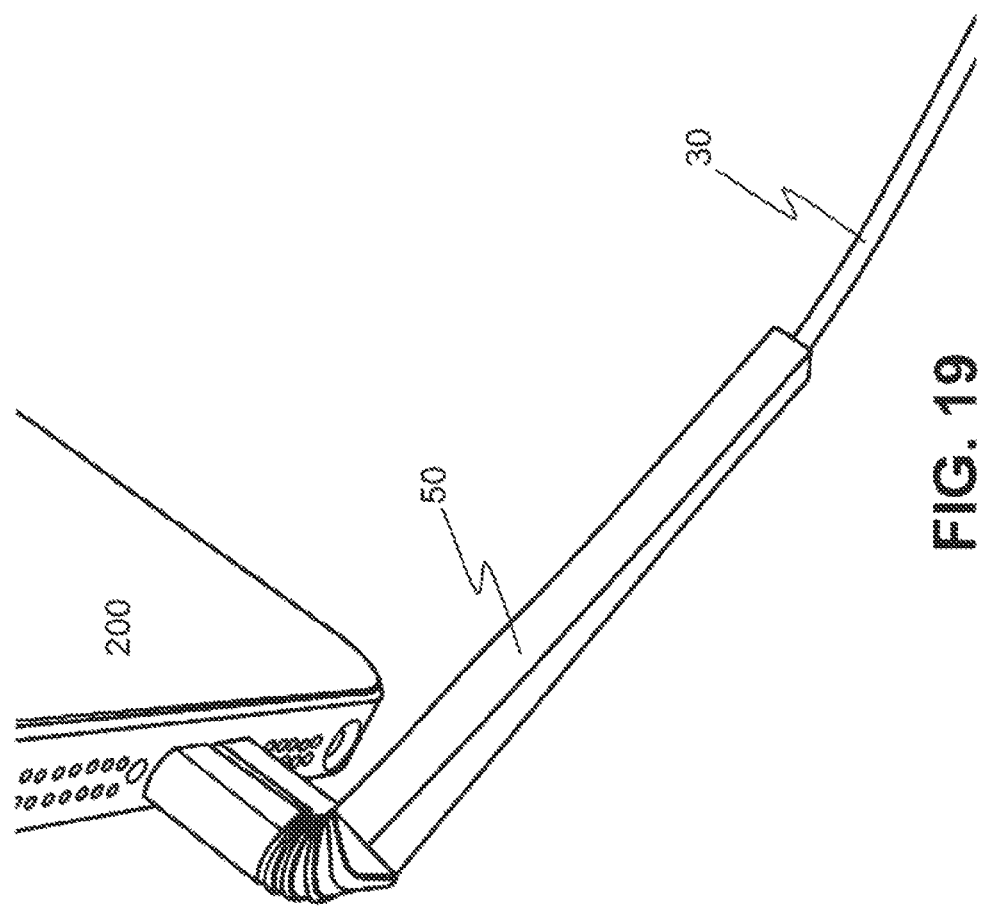
FIG. 19 is an isometric rear view of a flex and stay cell phone/electronic device charging stand connected to a cell phone wherein the sleeve attached UBS cord is bent towards the flat surface.
Figure 20:
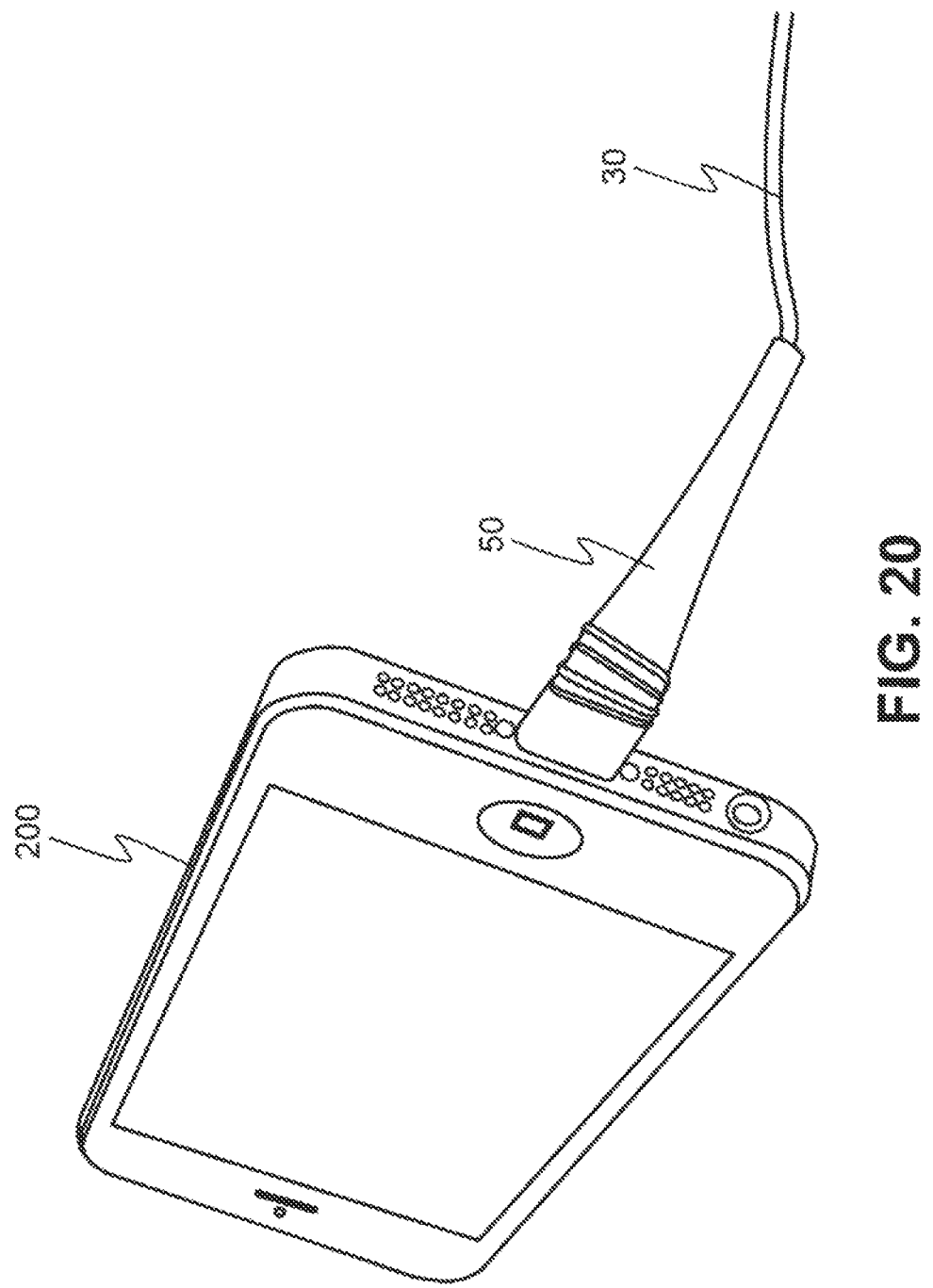
FIG. 20 is a zoomed out view of FIG. 18.

As shown in FIGS. 14-15, a cell phone cannot stand steadily when it is charged using a typical USB cable without being supported by a stand. Whereas when the USB cord is encircled by the removably attachable sleeve 50 as shown in FIGS. 16-20, the USB cable can be bent to create a stand to support the cell phone on a flat surface. FIG. 17 is an isometric front view of a flex and stay cell phone/electronic device charging stand connected to a cell phone wherein the sleeve attached UBS cord is bent in about 90 degree angle. FIG. 18 is an isometric front view of a flex and stay cell phone/electronic device charging stand connected to a cell phone wherein the sleeve attached UBS cord is bent towards the flat surface. FIG. 19 is an isometric rear view of a flex and stay cell phone/electronic device charging stand connected to a cell phone wherein the sleeve attached UBS cord is bent towards the flat surface. FIG. 20 is a zoomed out view of FIG. 18.

Figure 21:
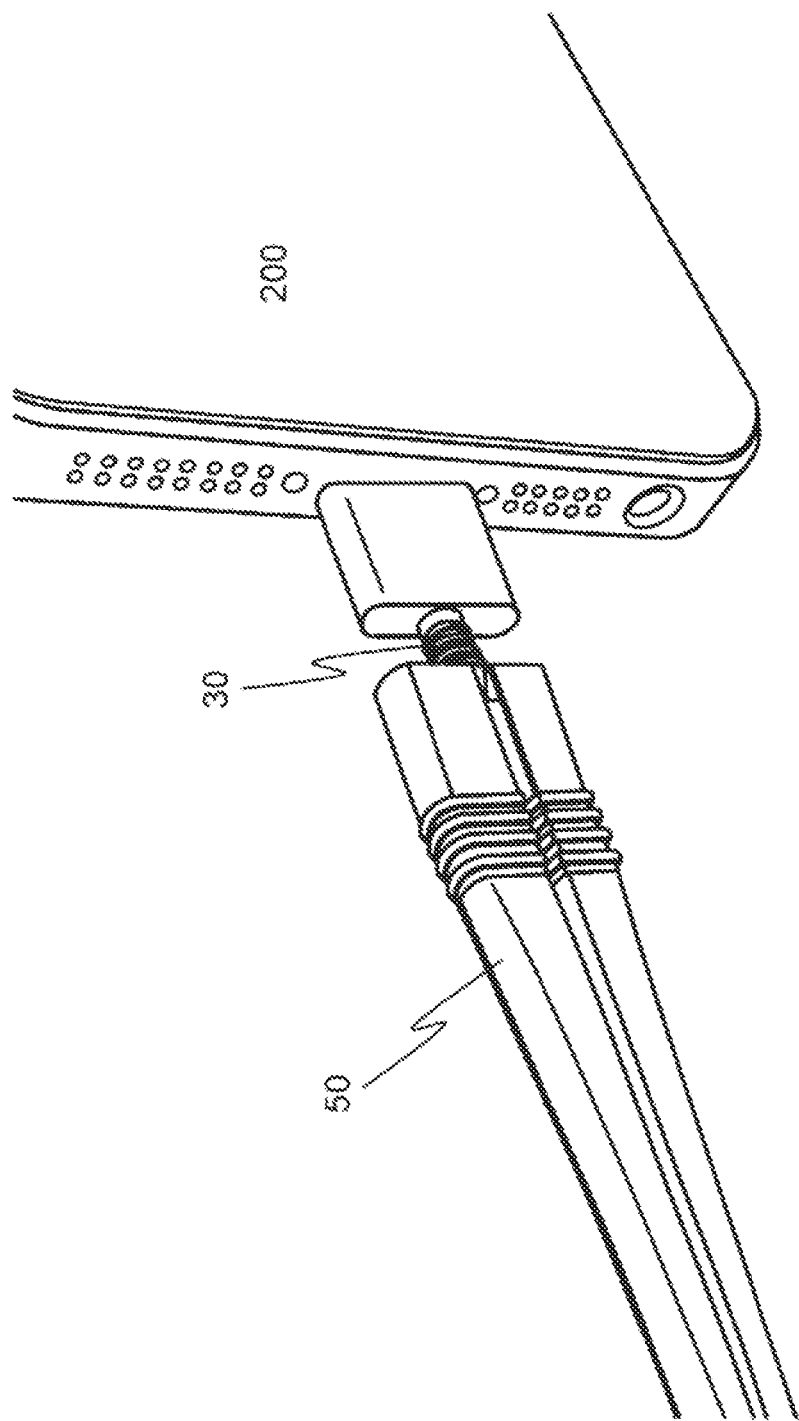
FIG. 21 is an isometric rear view of a flex and stay cell phone/electronic device charging stand connected to a cell phone wherein the removably attachable sleeve partially encircles the UBS cable.
Figure 22:
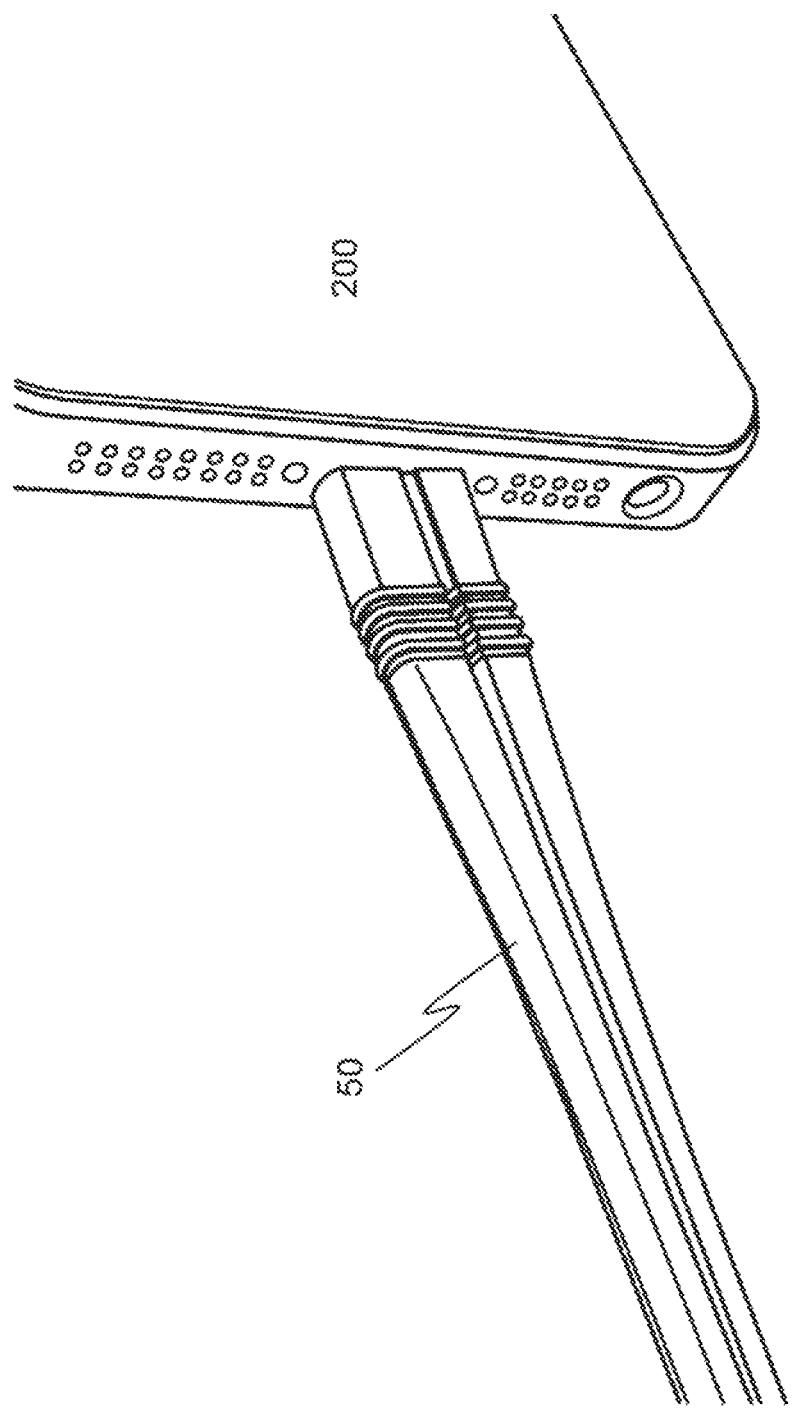
FIG. 22 is an isometric rear view of a flex and stay cell phone/electronic device charging stand connected to a cell phone wherein the removably attachable sleeve completely encircles the UBS cable.
Figure 23:
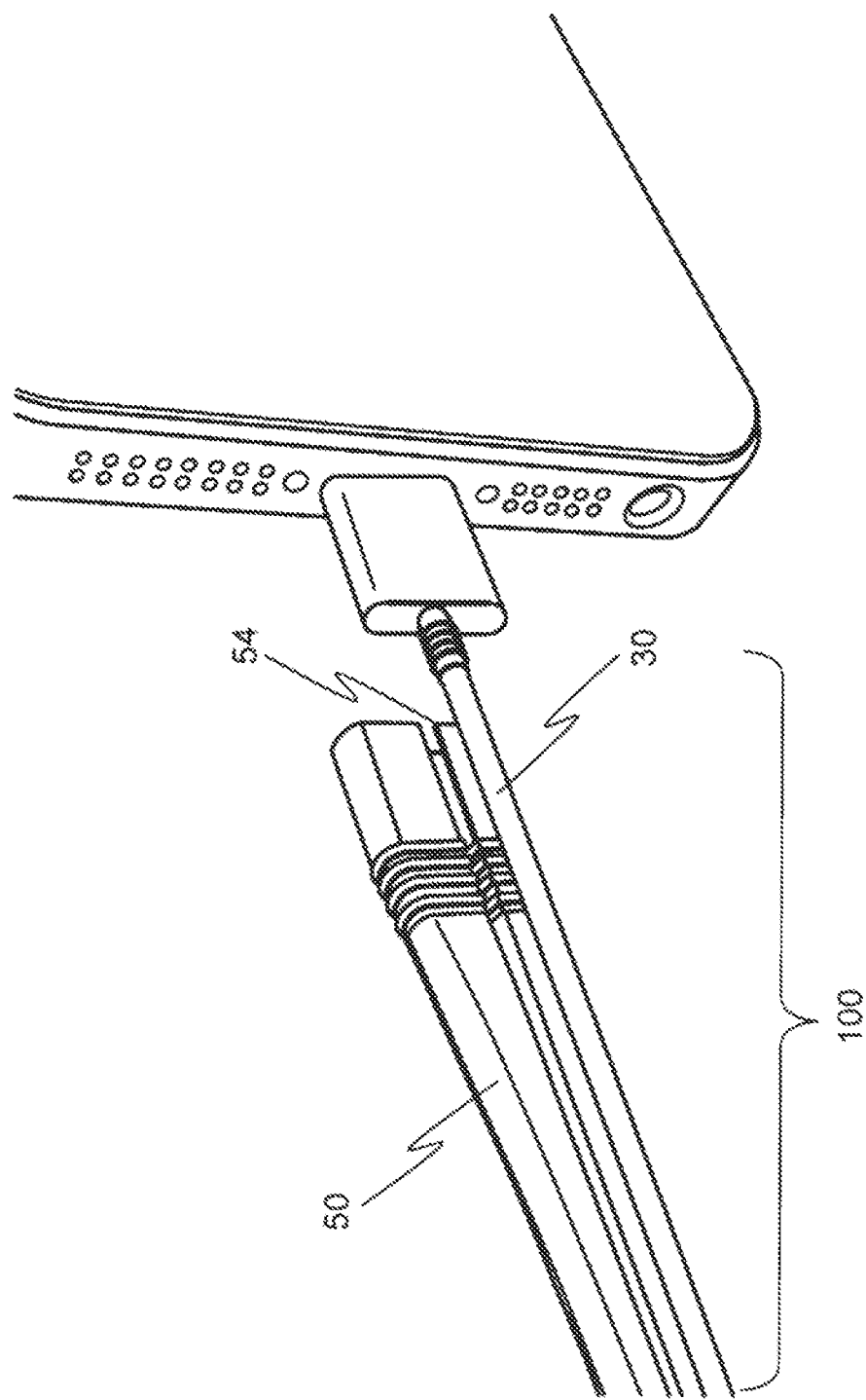
FIG. 23 is an isometric rear view of a flex and stay cell phone/electronic device charging stand connected to a cell phone wherein the removably attachable sleeve is separate from the UBS cable.

FIGS. 21-22 show the rear view of the removably attachable sleeve 50 attached to the USB cord 30. FIG. 21 is an isometric rear view of a flex and stay cell phone/electronic device charging stand connected to a cell phone wherein the removably attachable sleeve partially encircles the UBS cable. FIG. 22 is an isometric rear view of a flex and stay cell phone/electronic device charging stand connected to a cell phone wherein the removably attachable sleeve completely encircles the UBS cable. FIG. 23 is an isometric rear view of a flex and stay cell phone/electronic device charging stand connected to a cell phone wherein the removably attachable sleeve is separate from the UBS cable. FIG. 23 shows the rear view of the removably attachable sleeve 50 which is completely separate from the UBS cord 30. The groove 54 on the rear side along the length of the removably attachable sleeve 50 is clearly observed in FIG. 23.

Figure 24:
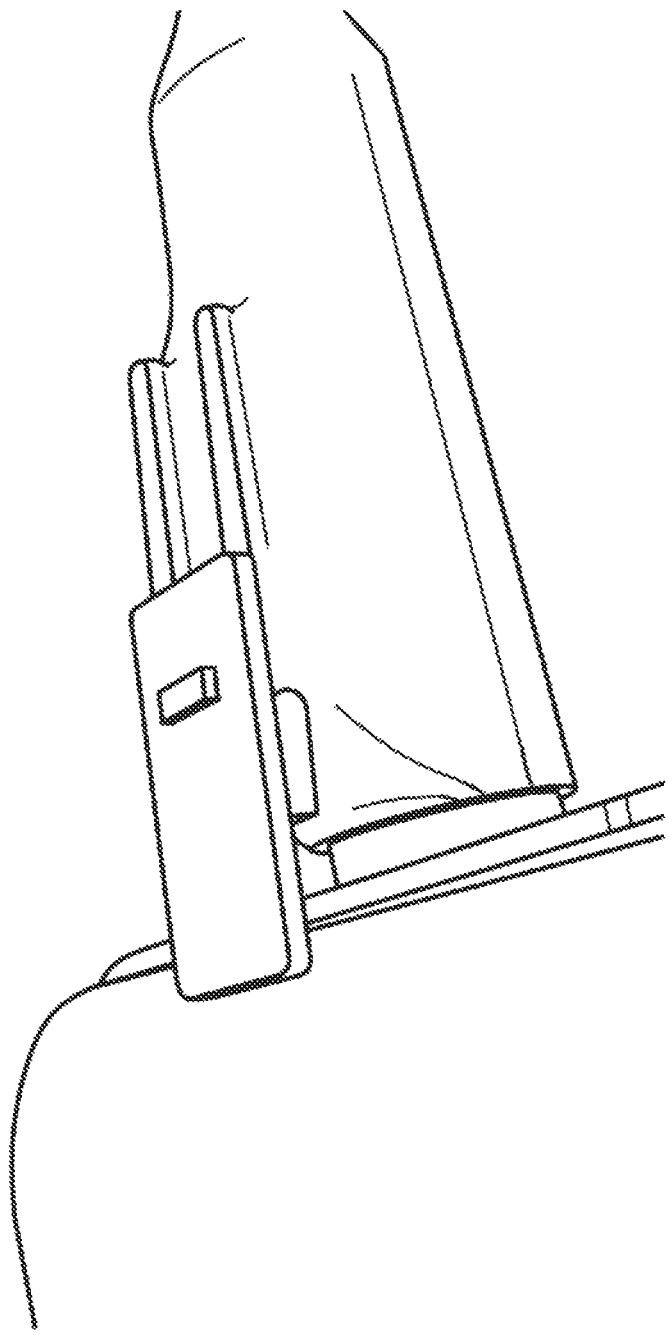
FIG. 24 shows a support clip extending along the flex and stay device.

FIG. 24 shows a support clip extending along the flex and stay device. This support clip when dosed is flush with the wire cable itself. Yet here in the open position it extends beyond the tip of the wire and positions itself along the electronic device framing itself. This feature allows for added support for the wire and distributes the pressure away from the port opening where too much pressure could cause damage to the electronic device.

Figure 25:
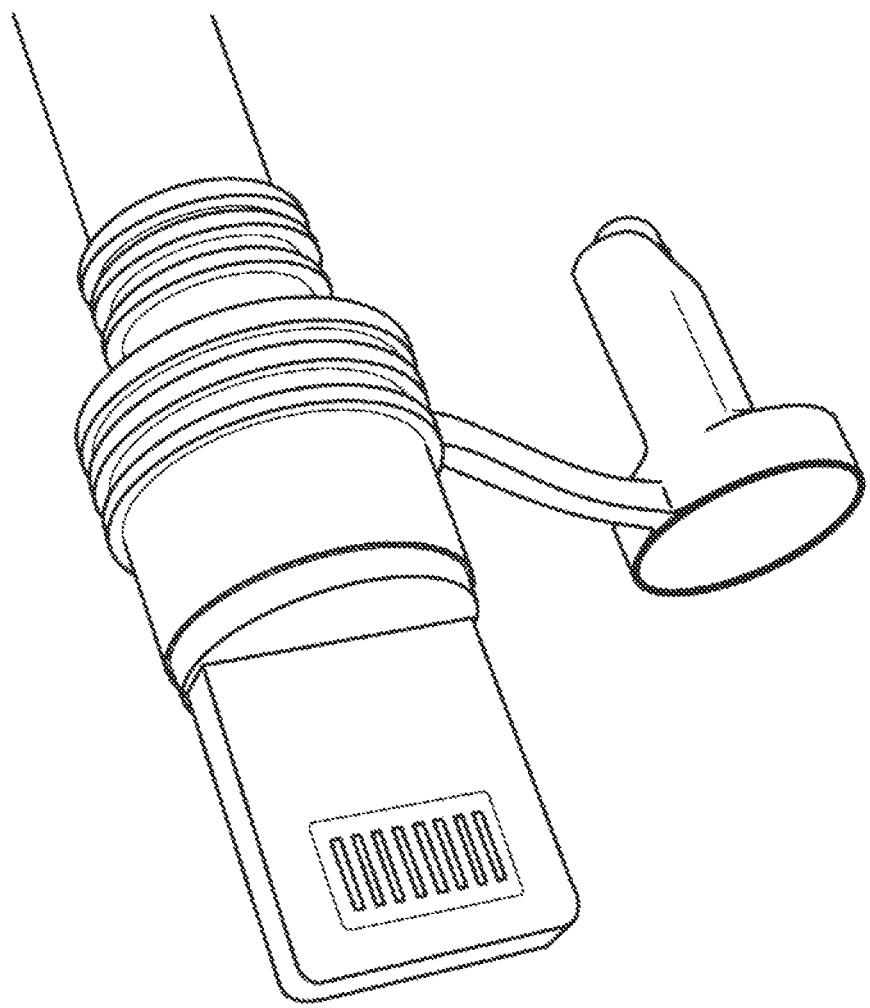
FIG. 25 shows an open cap tip protection covering with a stylist feature.

FIG. 25 shows an open cap tip protection covering with a stylist feature. A stylist is therefore at hand for use by the electronic device owner.

Figure 26:
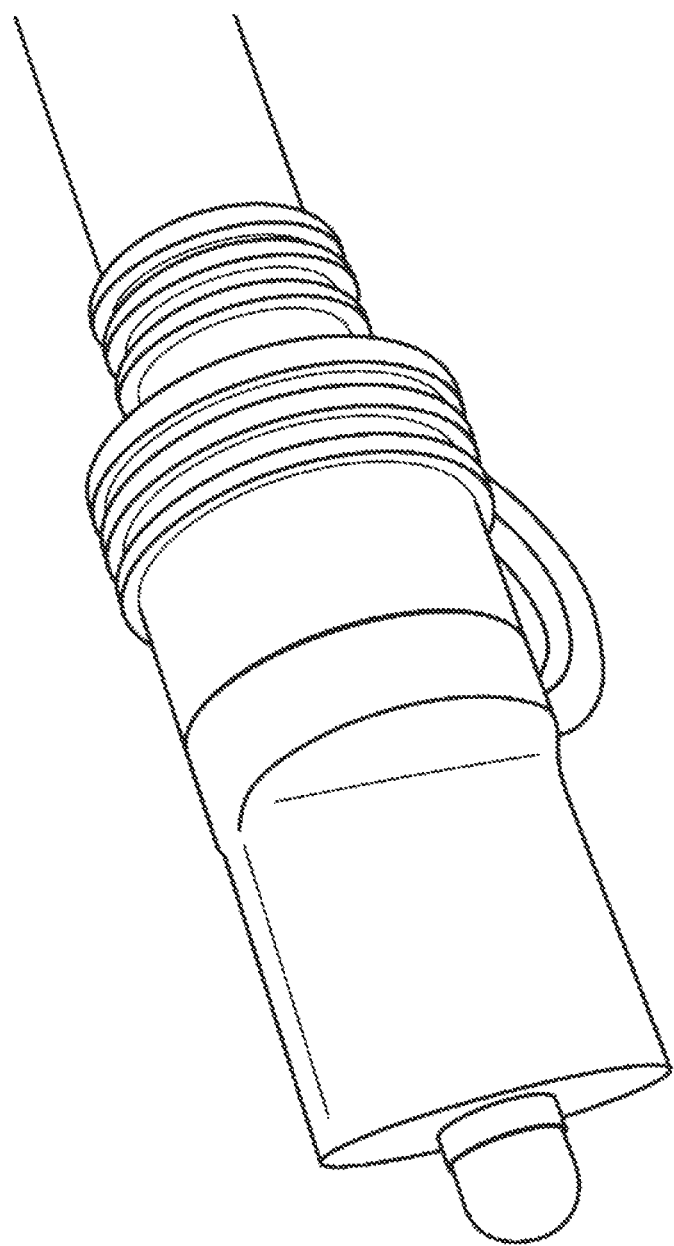
FIG. 26 shows a closed cap tip protection covering with a stylist feature.

FIG. 26 shows a closed cap tip protection covering with a stylist feature. Since the flex and stay wire is firm like a pen this stylist could be used as a handy feature.

Figure 27:
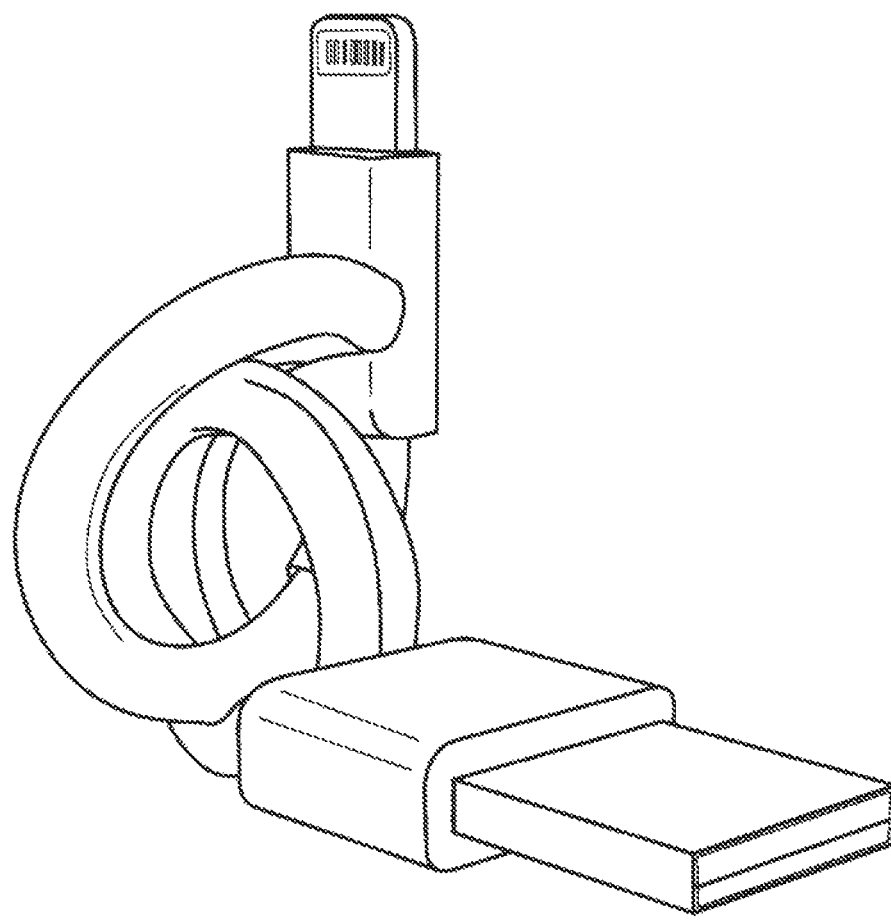
FIG. 27 shows a wrapping of the cord for neat storage using the flex and stay end portion as a bent holding feature.

FIG. 27 shows a wrapping of the cord for neat storage using the flex and stay end portion as a bent holding feature.

While there have been shown and described and pointed out the fundamental novel features of the invention as applied to the preferred embodiments, it will be understood that the foregoing is considered as illustrative only of the principles of the invention and not intended to be exhaustive or to limit the invention to the precise forms disclosed. Obvious modifications or variations are possible in light of the above teachings. The embodiments discussed were chosen and described to provide the best illustration of the principles of the invention and its practical application to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are entitled.

What is claimed is:

1. A flex and stay cell phone/electronic device charging stand comprising:
   a front-end USB plug for connecting to a cell phone or electronic device;
   a USB cord connecting to the front-end USB plug;
   a back-end USB plug for connecting to a battery charger; and
   a docking station which is located between the back-end USB plug and the USB cord and has a base and two bars perpendicularly protruding upwards at the front of the base, the shape of the base defines a slot configured to match the front-end USB plug;
   wherein the front-end USB plug snugly fits in the slot of the base when the front-end UB plug is connected to the cell phone or electronic device while the cell phone or electronic device stands within the docking station.

2. The flex and stay cell phone/electronic device charging stand of claim 1 further comprising:
   a removably attachable sleeve which has a groove at the rear side along the length for the front end of the USB cord to insert thereinto;
   wherein the removably attachable sleeve has a rigid region and a flex region, the removably attachable sleeve can be bent at the flex region to create a stand for holding the cell phone or electronic device in a standing position.

3. The flex and stay cell phone/electronic device charging stand of claim 2 further comprising:
   a universal battery charger with a USB port.

4. The flex and stay cell phone/electronic device charging stand of claim 3, wherein the base is substantially U-shaped and the slot defined by the shape of the base is substantially U-shape.

5. The flex and stay cell phone/electronic device charging stand comprising:
   a front-end USB plug for connecting to a cell phone or electronic device;
   a USB cord connecting to the front-end USB plug;
   a back-end USB plug for connecting to a battery charger; and
   a docking station which is located between the back-end USB plug and the USB cord and has a base and two bars perpendicularly protruding upwards at the front of the base, the shape of the base defines a slot configured to match the front-end USB plug;
   a removably attachable sleeve which has a groove at the rear side along the length for the front end of the USB cord to insert thereinto;

wherein the front-end USB plug snugly fits in the slot of the base when the front-end USB plug is connected to the cell phone or electronic device while the cell phone or electronic device stands within the docking station; and wherein the removably sleeve has a rigid region and a flex region, the removably attachable sleeve can be bent at the flex region to create a stand for holding the cell phone or electronic device in a standing position.

6. The flex and stay cell phone/electronic device charging stand of claim 5 further comprising:

a universal battery charger with a USB port.

7. The flex and stay cell phone/electronic device charging stand of claim 6, wherein the base is substantially U-shaped and the slot defined by the shape of the base is substantially U-shape.

8. A flex and stay cell phone/electronic device charging stand comprising:

a front-end USB plug for connecting to a cell phone or electronic device;

a USB cord connecting to the front-end USB plug;

a back-end USB plug for connecting to a battery charger; and a removably attachable sleeve which has a groove at the rear side along the length for the front end of the USB cord to insert thereinto;

a docking station which is located between the back-end USB plug and the USB cord and has a base and two bars perpendicularly protruding upwards at the front of the base, the shape of the base defines a slot configured to match the front-end USB plug;

wherein the front-end USB plug snugly fits in the slot of the base when the front-end USB plug is connected to the cell phone or electronic device while the cell phone or electronic device stands within the docking station, and wherein the removably sleeve has a rigid region and a flex region, the removably attachable sleeve can be bent at the flex region to create a stand for holding the cell phone or electronic device in a standing position.

9. The flex and stay cell phone/electronic device charging stand of claim 8 further comprising:

a universal battery charger with a USB port.

10. The flex and stay cell phone/electronic device charging stand of claim 9, wherein the base is substantially U-shaped and the slot defined by the shape of the base is substantially U-shape.

* * * * *